United States Patent
Pereira et al.

(10) Patent No.: US 6,445,628 B1
(45) Date of Patent: *Sep. 3, 2002

(54) ROW REDUNDANCY IN A CONTENT ADDRESSABLE MEMORY

(75) Inventors: Jose Pio Pereira, Santa Clara; Varadarajan Srinivasan, Los Altos Hills; Bindiganavale S. Nataraj, Cupertino; Sandeep Khanna, Santa Clara, all of CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/886,235

(22) Filed: Jun. 18, 2001

Related U.S. Application Data

(63) Continuation of application No. 09/590,779, filed on Jun. 8, 2000, now Pat. No. 6,249,467, which is a continuation-in-part of application No. 09/420,516, filed on Oct. 18, 1999, now Pat. No. 6,275,426.

(51) Int. Cl.$^7$ ................................................ G11C 7/00
(52) U.S. Cl. ...................... 365/200; 365/49; 365/230.03
(58) Field of Search ...................... 365/200, 49, 230.03, 365/189.01, 230.01

(56) References Cited

U.S. PATENT DOCUMENTS

| | | | |
|---|---|---|---|
| 3,633,175 A | 1/1972 | Harper | 340/172.5 |
| 5,046,046 A | 9/1991 | Sweha et al. | 365/200 |
| 5,319,589 A | 6/1994 | Yamagata et al. | 365/49 |
| 5,644,699 A | 7/1997 | Yoshida | 395/182.05 |
| 5,848,074 A | 12/1998 | Maeno | 714/720 |
| 6,275,406 B1 | 8/2001 | Gibson et al. | 365/49 |

OTHER PUBLICATIONS

U.S. Provisional Application No. 60/153,388 filed on Sep. 10, 1999 by Gibson et al.
U.S. Provisional Application No. 60/166,964 filed on Nov. 23, 1999 by Farhad Shafai.
Manu, Wada, Ieda, and Tanimoto, "A Redundancy Circuit for a Fault–Tolerant 256k MOS RAM," IEEE Journal of Solid–State Circuits, vol. SC–17, No. 4, Aug. 1982, pp. 726–731.
Smith, Chlipala, Bindels, Nelson, Fischer, and Mantz, "Laser Programmable Redundancy and Yield Improvement in a 64k DRAM," IEEE Journal of Solid–State Circuits, vol. SC–16, No. 5, Oct. 1981, pp. 506–513.
Uchida, Iizuka, Matsunaga, Isobe, Konishi, Sekine, Ohtani, and Kohyama, "A Low Power Resistive Load 64 kbit CMOS RAM," Journal of Solid–State Circuits, vol. SC–17, No. 5, Oct. 1982, pp. 804–808.

*Primary Examiner*—Hoai Ho
(74) *Attorney, Agent, or Firm*—William L Paradice, III

(57) ABSTRACT

A CAM device that allows defective rows in one CAM block to be functionally replaced by spare rows from any CAM block in the device. In some embodiments, the CAM device includes a main address decoder, a plurality of CAM blocks, a corresponding plurality of spare address decoders, and a block select circuit. In one embodiment, each CAM block includes a main CAM array having a plurality of rows of CAM cells each coupled to a corresponding word line, and a spare row of CAM cells coupled to a spare word line. Each spare row may be used to functionally replace a defective row in the same CAM block or in any other CAM block by programming the address of the defective row into the corresponding spare address decoder.

20 Claims, 14 Drawing Sheets

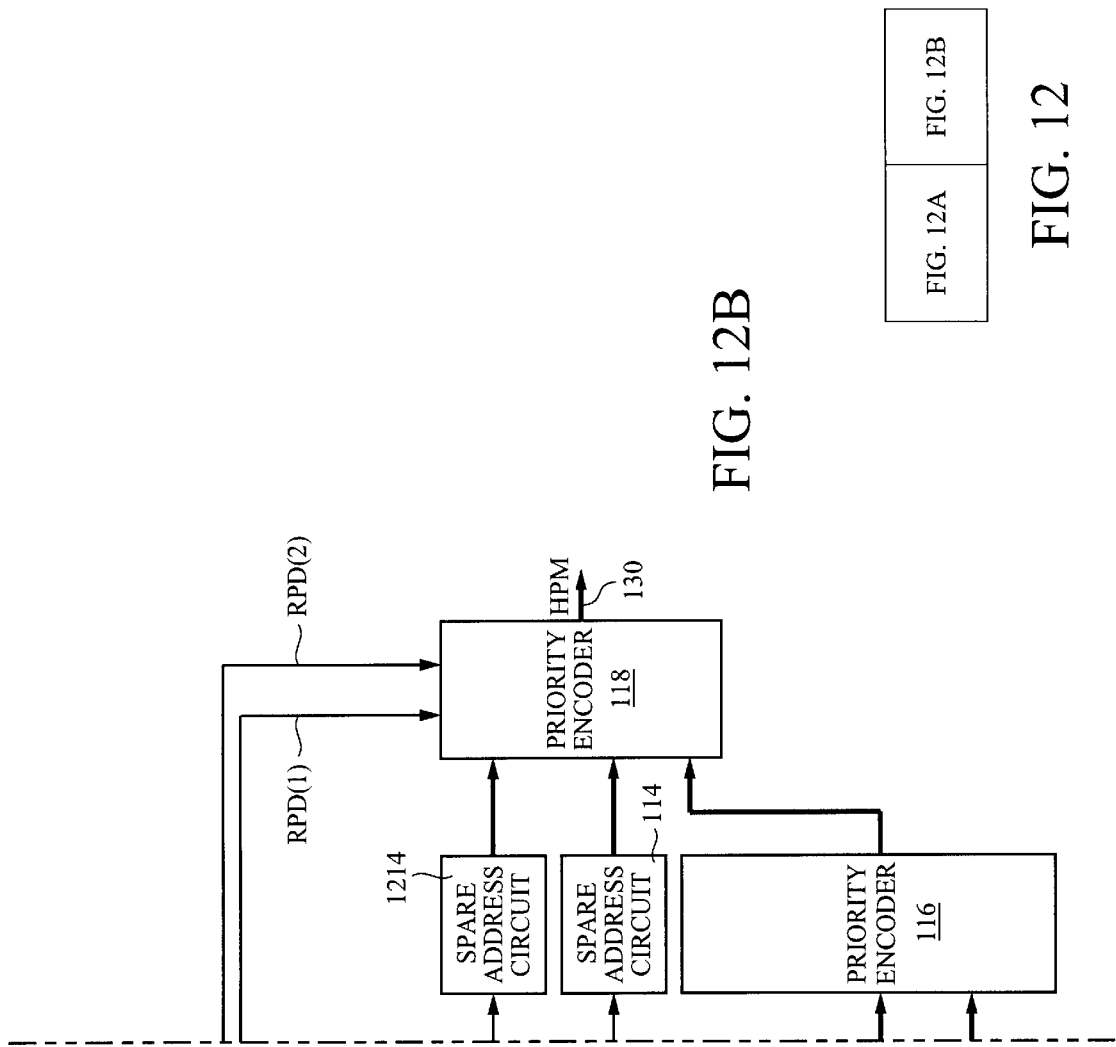

ROW REDUNDANCY IN A CONTENT ADDRESSABLE MEMORY

CROSS-REFERENCE TO RELATED APPLICATIONS

This application is a continuation of commonly owned U.S. patent application Ser. No. 09/590,779 entitled "ROW REDUNDANCY IN A CONTENT ADDRESSABLE MEMORY," filed on Jun. 8, 2000 and issued Jun. 19, 2001 as U.S. Pat. No. 6,249,467 B1, which is a continuation-in-part of commonly owned U.S. patent application Ser. No. 09/420,516 entitled "ROW REDUNDANCY FOR CONTENT ADDRESSABLE MEMORY," filed on Oct. 18, 1999 and issued Aug. 14, 2001 as U.S. Pat. No. 6,275,426 B1, both incorporated by reference herein.

FIELD OF INVENTION

The present invention relates generally to performing row redundancy in a content addressable memory (CAM) device.

BACKGROUND

Row and/or column redundancy has been used to improve the yield of memory devices such as static random access memory (SRAM) devices. A fuse element is typically placed in series with each word line in a main memory array. When a memory cell is determined to be defective, the fuse for the corresponding word line is blown to de-couple the main address decoder from the row incorporating the defective memory cell. The address of the defective row is programmed into a spare address decoder that selects a spare row of memory cells in response to subsequent read or write access operations to the defective address in the main memory array.

Traditional row redundancy techniques, however, do not scale well for content addressable memory (CAM) devices. A CAM device is a binary or ternary storage device that can simultaneously compare a specific pattern of comparand data with data stored in each row of CAM cells in its CAM array. Match results are reflected on match lines that are provided to a priority encoder that translates the matched location into a match address or CAM index for output from the CAM device. Each row of CAM cells is typically connected to a word line as in conventional SRAMs and at least one match line. Thus, in order to use traditional row redundancy techniques in a CAM array, each row of CAM cells would use a first fuse for the word line and a second fuse for the match line. Additionally, to ensure that the de-coupled match line did not provide erroneous data to the priority encoder, an additional pull-down circuit would be needed for each match line to guarantee that the de-coupled match line indicated a mismatch state for the defective row of CAM cells. The additional fuse per row, and pull-down circuitry per row, would increase the size of the CAM array. As fuses typically do not scale well with process technologies, this increase in the number of fuses is not readily remedied by migration to a smaller geometry fabrication process. Thus, it would be desirable to provide a row redundancy scheme for CAMs that is more area efficient than using fuses on each word line and each match line.

In addition, since manufacturing defects may not be uniform across a wafer, defective cells may be concentrated in certain portions of a CAM device. Thus, in a CAM device having a number of CAM blocks each including a main CAM array and a spare or redundant row, the defective cells may be concentrated in one or more of the CAM blocks. Consequently, while first CAM blocks may be defect free, second CAM blocks may have more than one defective row. Since each CAM block has only one spare row and therefore can replace only one defective row, the second CAM blocks having more than one defective row may not be usable, even though spare rows may be available in other CAM blocks. Thus, it would also be desirable to provide a row redundancy scheme for CAMs that allow spare row(s) from a first CAM block to be used to replace a defective row in a second CAM block.

SUMMARY OF THE INVENTION

A method and apparatus for performing row redundancy in a CAM device is disclosed that allows defective rows in one CAM block to be functionally replaced by spare rows from any CAM block in the device. In accordance with the present invention, the CAM device includes a main address decoder, a plurality of CAM blocks, a corresponding plurality of spare address decoders, and a block select circuit. In one embodiment, each CAM block includes a main CAM array having a plurality of rows of CAM cells each coupled to a corresponding word line, and a spare row of CAM cells coupled to a spare word line. Each spare row may be used to functionally replace a defective row in the same CAM block or in any other CAM block by programming the address of the defective row into the corresponding spare address decoder. During subsequent read or write operations, an input address is compared with the programmed addresses stored in the spare address decoders. If there is match, thereby indicating that the selected row is defective and has been replaced, the address decoder storing the matching programmed address enables the spare row in the corresponding CAM block, and the block select circuit enables the corresponding CAM block for the operation, so that the read or write operation accesses the spare row instead of the defective row. If there is not a match, the spare address decoder does not enable the corresponding spare word line, and the block select circuit enables the CAM block identified by the input address for the operation.

Other objects, features, and advantages of the present invention will be apparent from the accompanying drawings and from the detailed description that follows below.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

A method and apparatus for performing row redundancy in a CAM device is disclosed. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be buses. Additionally, the prefix symbol "/" or the suffix "B" attached to signal names indicates that the signal is an active low signal. Active low signals may be changed to active high signals as generally known in the art.

A method and apparatus for performing row redundancy in a CAM device is disclosed. The embodiments for performing row redundancy disclosed herein obviate the need for using fuses on the word lines and match lines in a CAM array. Thus, the size of the CAM array can be efficiently and compactly designed and fabricated without having to accommodate for the rather large fuses and any associated circuitry.

Figure 1:
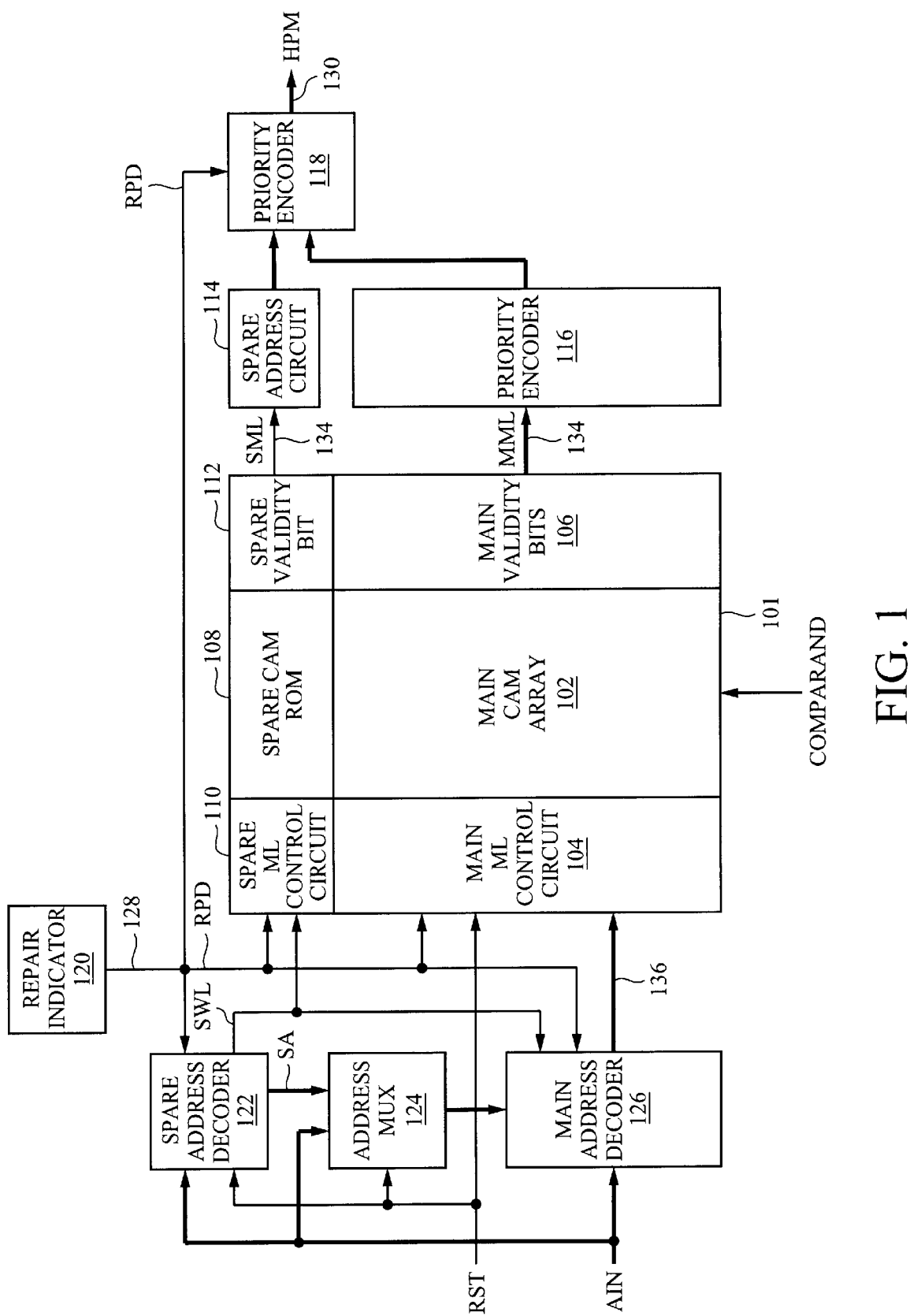
FIG. 1 is a block diagram of one embodiment of a CAM device including a spare CAM row.

One embodiment of the present invention is shown in FIG. 1. CAM device 100 of FIG. 1 includes CAM array 101 that has a main CAM array 102 and spare or redundant CAM row 108. The spare CAM row is an independent row of CAM cells that can be enabled by spare match line control circuit 110 to replace a row of CAM cells in the main CAM array that has one or more defective CAM cells. The main CAM cells and spare CAM cells can be any type of CAM cells including binary or ternary CAM cells.

Spare CAM row 108 can be programmed to replace a defective row of CAM cells in main CAM array 102 as follows. Initially, the main CAM array is tested using any generally known testing methodology and hardware to determine if any of the CAM cells in the main CAM array are defective. When a defective CAM cell is detected, the address of the defective CAM cell is programmed into spare address decoder 122 and into spare address circuit 114. The programmed address becomes the address of the spare CAM row. For an alternative embodiment, spare address decoder 122 and spare address circuit 114 may be the same circuit or share programmable elements. Additionally, repair indicator circuit 120 is programmed to assert repair signal RPD to a high logic state on signal line 128. For an alternative embodiment, spare address decoder 122 or spare address circuit 114 may generate RPD. Programming of the spare address decoder and the repair circuit may be accomplished using conventional programming techniques including electrical programming or laser programming of fuses, or by programming or writing to volatile or nonvolatile memory elements.

Figure 5:
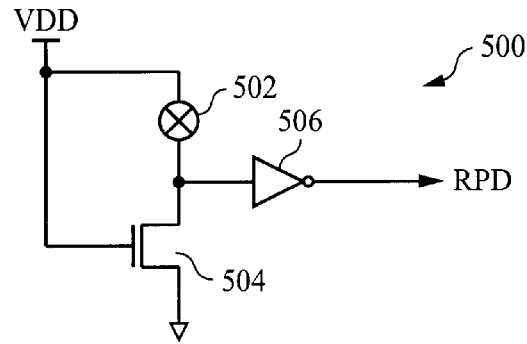
FIG. 5 is a circuit diagram of one embodiment of the repair indicator circuit of FIG. 1.

FIG. 5 shows repair indicator circuit 500 that is one embodiment of the repair indicator circuit 120 of FIG. 1. Other embodiments may be used. Repair indicator circuit 500 includes a fuse element 502, transistor 504 and inverter 506. Fuse element 502 is coupled between power supply voltage VDD and the drain of transistor 504. Transistor 504 has its gate coupled to VDD and its source coupled to ground. Inverter 506 has its input coupled to the drain of transistor 504, and provides RPD from its output. Fuse element 502 may be an electrical or laser programmable fuse. For other embodiments, fuse 502 may be replaced with a programmable memory element including a volatile or nonvolatile memory element.

When CAM device 100 is powered for normal operation after initial testing, a reset signal RST is asserted to a high logic state to reset CAM device 100 to a known state. When programmed, spare address decoder 122 outputs the programmed spare address SA during the reset state to main address decoder 126 via address multiplexer 124. Main address decoder 126 may be any type of address decoder. Main address decoder 126 decodes SA and provides the decoded spare address to main match line control circuitry 104 and main CAM array 102 over signal lines 136. In response to RST indicating that a reset operation is being performed, and RPD indicating that main CAM array 102 has been repaired, main match line control circuitry 104 forces the match line of the defective row in main CAM array 102 to a mismatch state to disable the defective row from affecting compare operations on the main CAM array. The mismatch state is latched or registered such that when the reset operation is completed the mismatch state remains for the defective row. Main match line circuitry 104 performs the disabling function without using fuses on either the word lines or the match lines for the rows of CAM cells in main CAM array 102.

For an alternative embodiment, a row in main array 102 may be replaced by spare row 108 in response to an operation other than during a reset operation. For example, RST may be signal that indicates that a repair operation (e.g., in response to a "set repair" instruction) or a redundancy operation (e.g., in response to an "enable redundancy" instruction). Alternatively, RST may be a signal that indicates that power has been applied to CAM device 100 and CAM device auto-configures itself to determine if a repair has occurred and to perform the redundancy operation.

Each row of CAM cells in main array 102 may have one or more validity bits 106, and spare row 108 may have its own validity bit(s) 112. The validity bits indicate whether the corresponding rows of CAM cells are in a valid state or an empty state. A flag circuit (not shown) may monitor the state of validity bits 106 and 112 to identify a full condition for array 101. Array 101 is full when all of the non-defective rows of CAM cells in main CAM array 102 are filled with valid entries and spare CAM row 108 has a valid entry. In this state, match line control circuitry 104 may also cause the validity bit(s) 106 associated with the defective row in main array 102 to be set to a valid state in order to appropriately generate a full flag for array 101.

When RPD is asserted to a high logic state, spare match line control circuit 110 enables or activates spare CAM row 108 to operate as a row of CAM cells for main CAM array 102 and effectively replace the defective row in array 102. For one embodiment, RPD causes spare match line control circuit 110 to pre-charge the spare match line of spare CAM row 108. When RPD is asserted to a low logic state indicating that there is no defective row in main array 102, the spare match line control circuit forces the spare match line of spare CAM row 108 to a mismatch state such that it does not affect subsequent compare operations on main array 102. Spare match line control circuit 110 may directly force the spare match line to a mismatch state, for example, by discharging the spare match line. Alternatively, the spare match line control circuit may force a mismatch state by forcing the output of a comparison of comparand data and data stored in the spare row to always be a mismatch.

After the defective row in main CAM array 102 has been forced to a mismatch state, subsequent reads and writes to the address of the defective row will instead access spare CAM row 108. For example, a read or write operation to the address of the defective row (i.e., the programmed spare address) is performed as follows. Address AIN is simultaneously provided to main address decoder 126 and spare address decoder 122. AIN may be provided externally from another device or user, or internally, for example, as the next free address (NFA), the highest priority address, or a burst address. Spare address decoder 122 compares AIN with its programmed spare address. If there is a match, spare address decoder 122 asserts spare word line SWL to a high logic state to select spare CAM row 108 for the read or write operation. Reads and writes to spare CAM row 108 or main CAM array 102 may be performed by conventional read and write circuits (not shown). When the operation is a write operation, spare validity bit(s) 112 may also be updated to indicate that valid data is present in spare CAM row 108.

SWL is also provided to main address decoder 126. If SWL is asserted to a high logic state, spare CAM row 108 is selected and main address decoder 126 does not provide a decoded address to main CAM array 102. If SWL is asserted to a low logic state, then AIN does not match the programmed spare address and main address decoder 126 outputs a decoded input address to main array 102.

During a compare operation, comparand data is provided to and compared with data stored in both main CAM array 102 and spare CAM row 108. The comparison result with the data stored in spare CAM row 108 is reflected on spare match line SML 132, and the comparison results with the data stored in main CAM array 102 are reflected on main match lines MML 134. If SML indicates that there is a match between the comparand data and the data stored in spare CAM row 108, SML causes spare address circuit 114 to output the programmed spare address to priority encoder 118. Priority encoder 118 compares the spare address with the encoded address(es) of any other matching locations in main array 102, and outputs the highest priority matching address HPM on signal lines 130. HPM may be the address with the lowest value or the highest value.

When RPD is in a low logic state and the spare CAM row has not been enabled by spare match line control circuit 110, SML indicates a mismatch state. In this state, priority encoder 118 may ignore the output from spare address circuit 114 (i.e., it is an invalid address). For another embodiment, SML may be provided to priority encoder 118 to indicate whether priority encoder 118 should ignore the output of spare address circuit 114. Alternatively and/or additionally, priority encoder 116, or match flag circuit (not shown), may generate one or more match flag signals in response to MML and/or SML, and provide the match flag signal(s) to priority encoder 118 to indicate whether the encoded address output by priority encoder 116 (and/or spare address circuit 114) is valid or invalid.

Figure 2:
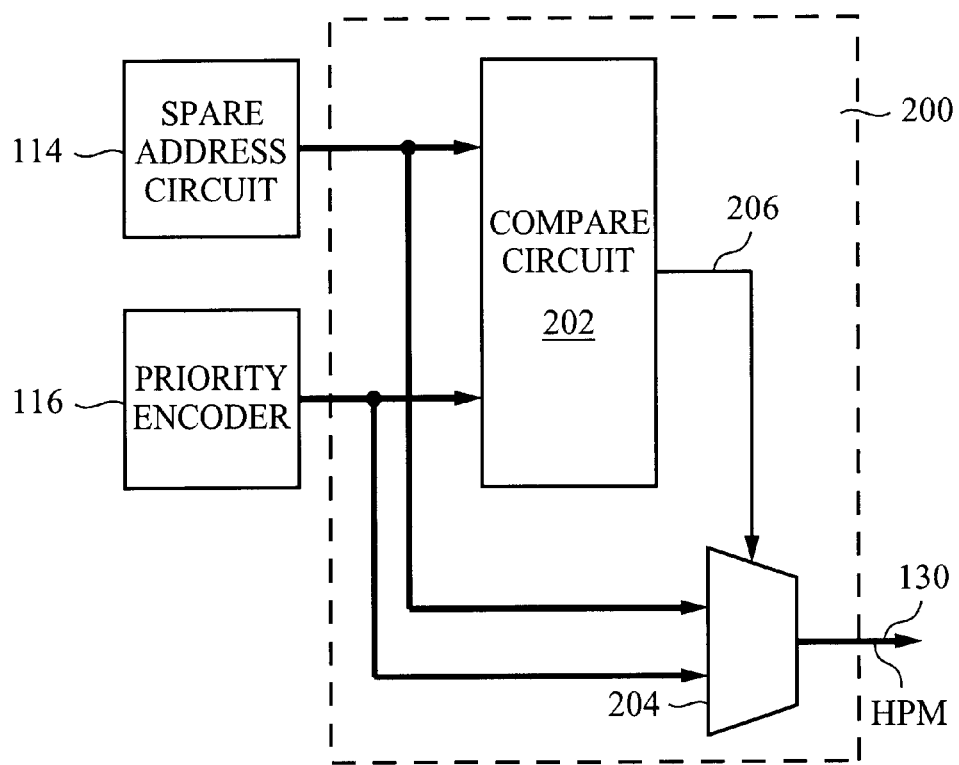
FIG. 2 is a block diagram of one embodiment of the priority encoder of FIG. 1.
Figure 3:
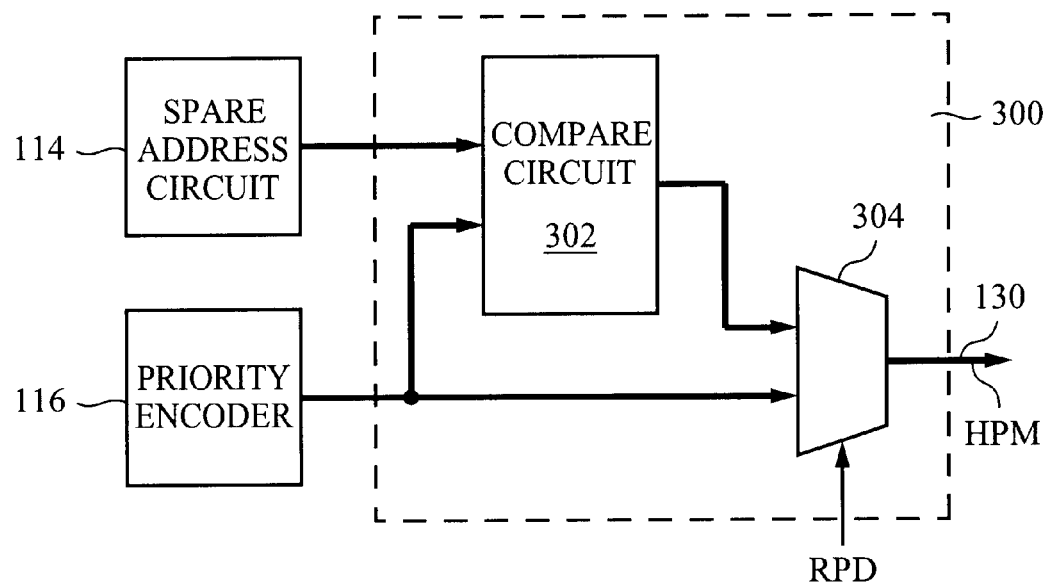
FIG. 3 is a block diagram of another embodiment of the priority encoder of FIG. 1.

Priority encoder 118 may be any type of priority encoder. Priority encoder 118 may also be formed from a compare circuit and a multiplexer as shown in FIGS. 2 and 3. FIG. 2 shows priority encoder 200 that includes compare circuit 202 and multiplexer 204. Compare circuit 202 compares the encoded addresses output by spare address circuit 114 and priority encoder 116, and indicates on signal line 206 which of the encoded addresses is the higher priority address. The higher priority address is then output by multiplexer 204 as HPM. Compare circuit 202 may also receive an indication of whether there is a match in spare CAM row 108 and/or main array 102 to determine whether to perform the comparison.

FIG. 3 shows priority encoder 300 that includes compare circuit 302 and multiplexer 304. Compare circuit 302 compares the encoded addresses output by spare address circuit 114 and priority encoder 116, and provides the higher priority address to one input of multiplexer 304. The other input of multiplexer 304 receives the output of priority encoder 116. Multiplexer 304 is controlled by RPD. When RPD is high indicating that a defective row has been replaced in main array 102, then multiplexer 304 provides the output of compare circuit 302 as HPM. Conversely, when RPD is low indicating that no defective row has been replaced in main array 102, then multiplexer 304 provides the output of priority encoder 116 as HPM. As with compare circuit 202, compare circuit 302 may also receive an indication of whether there is a match in spare CAM row 108 and/or main array 102 to determine whether to perform the comparison or output one of the encoded addresses directly to multiplexer 304. For another embodiment, multiplexer 304 may not be used, and HPM provided directly from compare circuit 302.

Figure 4:
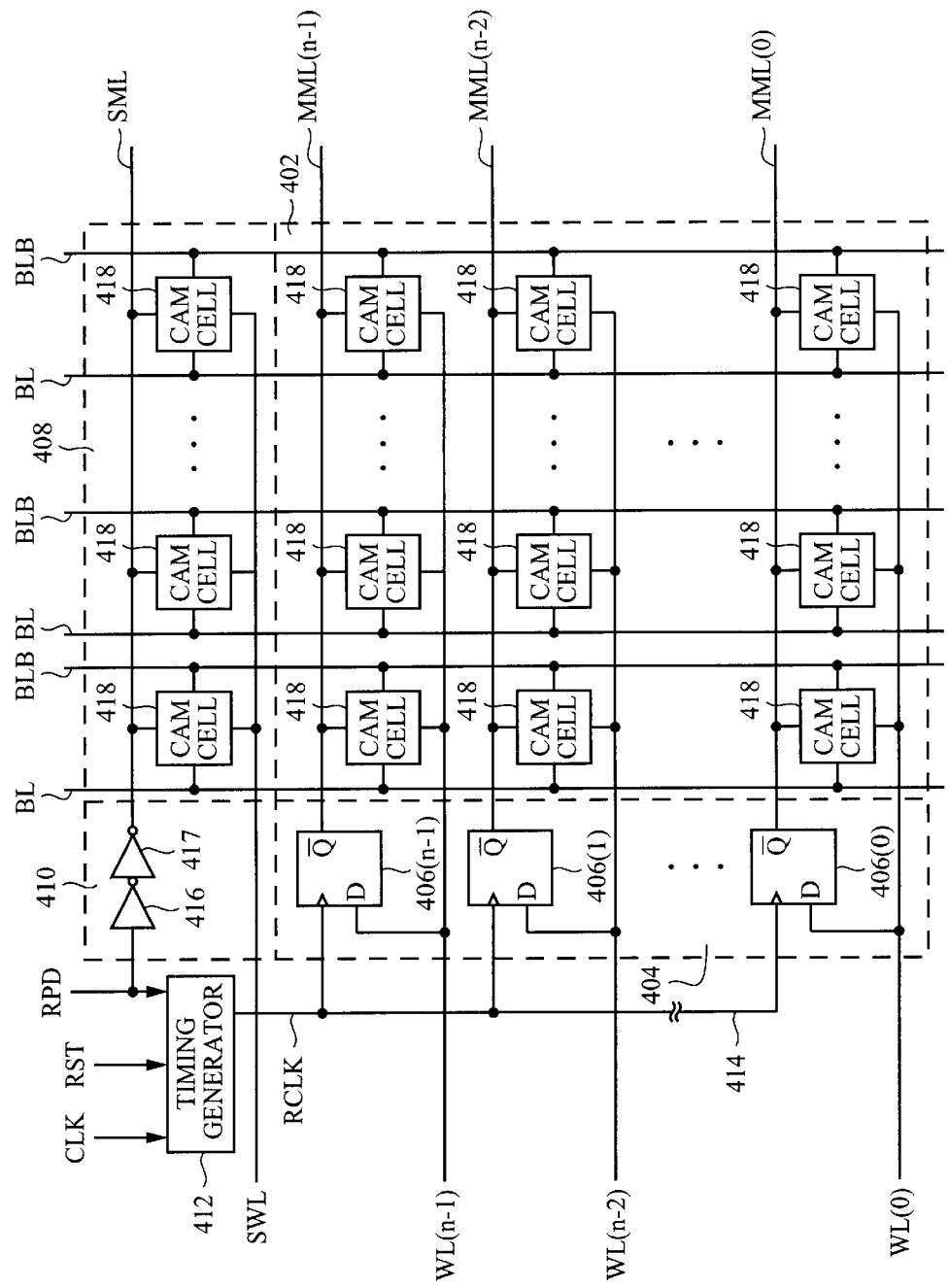
FIG. 4 is a logic diagram of one embodiment of the main match line control circuitry and the spare match line control circuit of FIG. 1.

FIG. 4 shows main CAM array 402 that is one embodiment of main CAM array 102, spare CAM row 408 that is one embodiment of spare CAM row 108, main match line control circuitry 404 that is one embodiment of main match line control circuitry 104, and spare match line control circuit 410 that is one embodiment of match line control circuit 110. Main CAM array 402 includes an array of CAM cells 418 that may be any type of CAM cells including binary or ternary CAM cells. Each CAM cell is coupled to one of n word lines WL(0) through WL(n−1) that are coupled to main address decoder 126. Each CAM cell is also coupled to one of n main match lines MML(0) through MML(n−1). For other embodiments, there may be more than one main match line or more than one word line per row of CAM cells. Each CAM cell is also coupled to an independent pair of bit lines BL and BLB that provide write data and/or comparand data. For alternative embodiments, one or more separate comparand bit lines may be included to provide the comparand data to the CAM cells.

Main match line control circuitry 404 includes n latch circuits 406(0) through 406(n−1), where each latch is coupled to one of the rows of CAM cells in main array 402. Each latch has its data input coupled to the word line for that row of CAM cells, its inverted data output coupled to the main match line for that row of CAM cells, and its clock input coupled to a redundancy clock signal RCLK. RCLK is generated by timing generator 412 in response to RST, RPD, and/or a clock signal CLK. Timing generator 412 may be any clock generator circuit. For one embodiment, timing generator 412 may be a gated clock generator. For example, timing generator 412 may be an AND gate. The latch circuits may be transparent latches, D latches, other types of flip-flop circuits, or other types of memory circuits including volatile or nonvolatile memory circuits.

Spare CAM row 408 also includes a row of CAM cells 418 that are each coupled to spare word line SWL, spare match line SML, and a pair of bit lines BL and BLB. Spare match line control circuit 410 includes inverters 416 and 417 that control whether SML is pre-charged or discharged in response to RPD. SML is enabled or pre-charged by inverters 416 and 417 when RPD is in a high logic state, and is disabled or forced to a mismatch low logic state by inverters 416 and 417 when RPD is in low logic state. For an alternative embodiment, inverters 416 and 417 may be replaced by non-inverting buffer circuitry or other logic gates.

The operation of FIG. 4 to replace a row in main array 402 with spare row 408 is as follows. Assume that one of the CAM cells in row zero of main array 408 has been determined to be defective. In response, RPD is asserted to a high logic state, inverters 416 and 417 pre-charge or enable SML, and address zero is programmed into spare address decoder 122 and spare address circuit 114 of FIG. 1. During a reset operation, RST is asserted to a high logic state and address zero is provided to main address decoder 126. Main address decoder 126 decodes the address and asserts WL(0) to a high logic state, and asserts all other word lines to a low logic state. When timing generator 412 asserts RCLK to a high logic state, latch 406(0) drives MML(0) to a low logic state indicating a mismatch condition for row zero of main array 402. All other latches will drive the other main match lines to a high logic state effectively pre-charging these match lines. Thus, during the reset operation, the main match line of row zero is forced to a mismatch state, and the other main match lines and the spare match line are pre-charged. When match lines are pre-charged to a high logic state, subsequent compare operations that indicate a mismatch between one of the CAM cells 418 and comparand data will discharge the match line, while matches will leave the match line unaffected.

Figure 6:
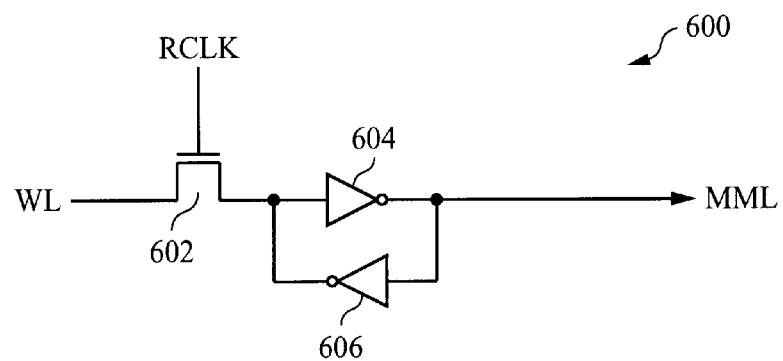
FIG. 6 is a circuit and logic diagram of one embodiment of the latch circuits of FIG. 4.
Figure 7:
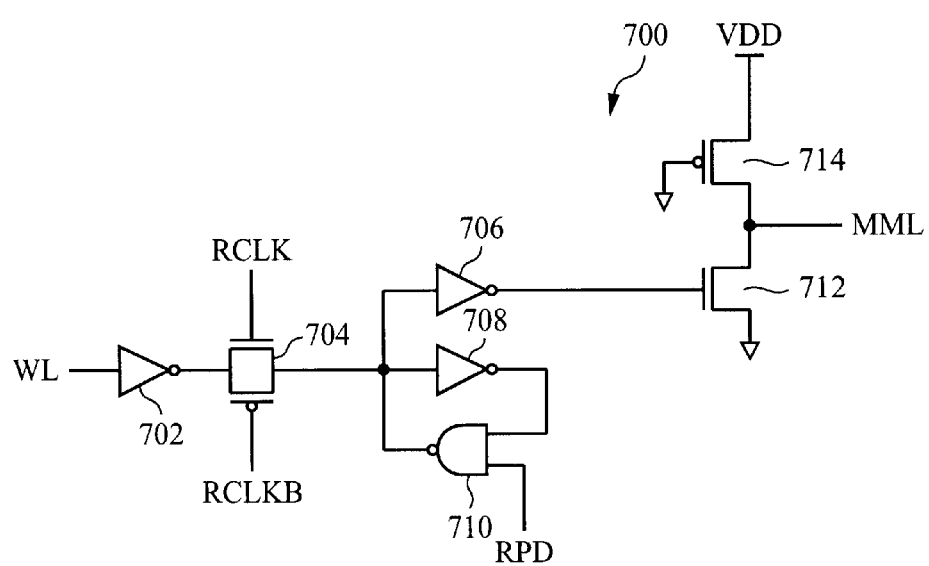
FIG. 7 is a circuit and logic diagram of another embodiment of the latch circuits of FIG. 4.

As indicated above, any latch circuit may be used for latches 406(0) through 406(n−1). FIGS. 6 and 7 shows two non-exhaustive embodiments. FIG. 6 shows latch 600 that includes pass transistor 602 and inverters 604 and 606. Pass transistor 602 provides the word line signal to the cross-coupled inverters 604 and 606 in response to RCLK. Latch 600 allows the complement of the logical state of WL to propagate through to MML when RCLK is high, and latches the state of MML when RCLK transitions to a low logic state.

FIG. 7 shows latch 700 that includes CMOS transmission gate 704, NAND gate 710, transistors 712 and 714, and inverters 702, 706 and 708. Transmission gate 704 has its gates coupled to RCLK and its logical complement RCLKB, an input terminal coupled to WL via inverter 702, and an output terminal coupled to the inputs of inverters 706 and 708. Inverter 708 has its output coupled to one input of NAND gate 710. NAND gate 710 has its other input coupled to RPD, and its output coupled to the inputs of inverters 706 and 708. Transistor 712 has its gate coupled to the output of inverter 706, its source coupled to ground, and its drain coupled to MML. P-channel transistor 714 is configured as a pre-charge circuit with its source coupled to VDD, its gate coupled to ground, and its drain coupled to the drain of transistor 712. Other pre-charge circuits may be used. Latch 700 allows the complement of the logical state of WL to propagate through to MML when RCLK is high and RPD is high, and latches the state of MML when RCLK transitions to a low logic state.

Figure 8:
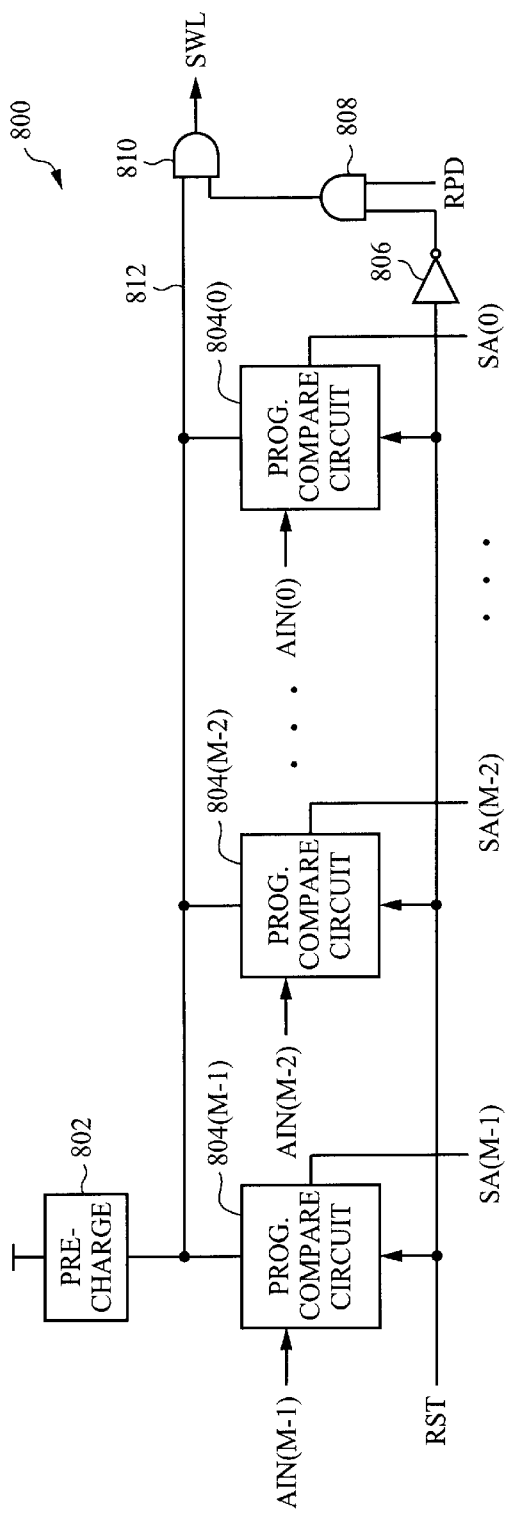
FIG. 8 is a block diagram of one embodiment of the spare address decoder of FIG. 1.

Any programmable spare address decoder may be used for spare address decoder 122 of FIG. 1. FIG. 8 shows spare address decoder 800 that is one embodiment of spare address decoder 122. Spare address decoder 800 includes m programmable compare circuits 804(m−1) to 804(0), one for each of m bits of the programmed spare address SA. Each programmable compare circuit is programmed with one bit of the spare programmed address SA. Unlike typical spare address decoders, the programmable compare circuits output the programmed spare address SA when RST is asserted to a high logic state. The RST signal is also provided as one input to a logic circuit that includes inverter 806 and AND gates 808 and 810. AND gate 808 has one input coupled to RST via inverter 806, and another input coupled to receive RPD. AND gates 810 has one input coupled to the output of AND gate 808, another input coupled to signal line 812, and provides SWL at its output. For another embodiment, AND gates 808 and 810 may be replaced with a single AND gate.

During read and write operations (RST logic low), each programmable compare circuit compares one bit of the input address AIN with one bit of the programmed spare address. If RPD is low, indicating that the spare CAM row is not enabled, AND gates 808 and 810 force SWL to a low logic state such that the spare CAM row is disabled from writing or reading operations. If RPD is a high logic state, then the logic state of SWL will be determined by the state of signal line 812. Signal line 812 is coupled to each of programmable compare circuits 804 and is pre-charged to a high logic state by pre-charge circuit 802. If AIN matches the programmed spare address stored in the programmable compare circuits, then signal line 812 remains pre-charged and SWL is asserted to a high logic state to select the spare CAM row. If, however, one of the bits of AIN does not match one of the SA bits, then signal line 812 is discharged and SWL deselected to a low logic state.

Figure 9:
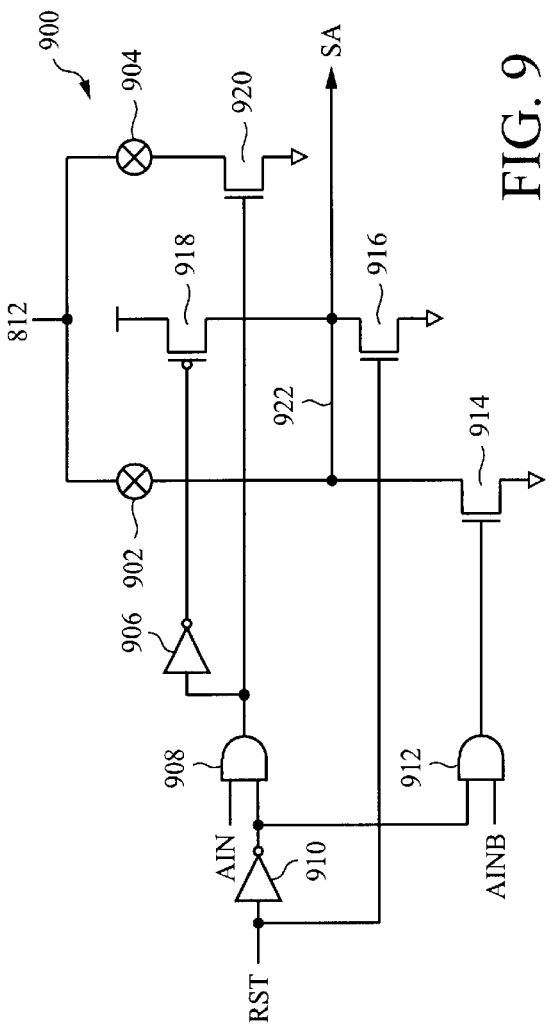
FIG. 9 is a circuit diagram of one embodiment of a programmable compare circuit of FIG. 8.

FIG. 9 shows programmable compare circuit 900 that is one embodiment of each of programmable compare circuits 804 of FIG. 8. Other embodiments may be used. Programmable compare circuit 900 includes programmable fuse 902 coupled in series with transistor 914 between signal line 812 and ground, and programmable fuse 904 coupled in series with transistor 920 between signal line 812 and ground. Fuses 902 and 904 may be programmed electrically, may be laser fuses, or may be any other type of programmable element including a memory element. When circuit 900 stores a logic zero, programmable fuse 902 is blown to de-couple signal line 812 from transistor 914. When circuit 900 stores a logic one, programmable fuse 904 is blown to de-couple signal line 812 from transistor 920.

The gate of transistor 914 is controlled by AND gate 912, which has one of its inputs coupled to AINB (the logical complement of AIN), and another one of its inputs coupled to the logical complement of RST via inverter 910. The gate of transistor 920 is controlled by AND gate 908, which has one of its inputs coupled to AIN, and another one of its inputs coupled to the logical complement of RST via inverter 910. AND gate 908 also controls the gate of p-channel transistor 918 via inverter 906. Transistor 918 is coupled in series with transistor 916 between a power supply voltage and ground. Transistor 916 has its gate controlled by RST, and its drain is coupled to signal line 922 that carries one bit of SA. Node 922 is also coupled to the drain of transistor 914 and fuse 902.

When RST is high, transistors 920 and 914 are turned off such that the logical state of signal line 812 is not affected by circuit 900, and SA will be reflected on signal line 922. For example, if a zero is programmed into compare circuit 900, fuse 902 is blown and transistor 916 pulls signal line 922 to a low logic state when RST is high. If a one is programmed into compare circuit 900, fuse 904 is blown and the pre-charged state of signal line 812 pulls signal line 922 to a high logic state. Transistor 916 can be sized such that pre-charge circuit 802 can pull signal line 922 to a high logic state when transistor 916 is on.

When RST is low and a read or write operation is taking place, circuit 900 operates as follows. If AIN matches the programmed spare address bit, then the logical state of signal line 812 is unaffected by circuit 900. For example, if a zero is programmed into circuit 900, AIN is a low logic state, AINB is a high logic state, transistor 920 is off, and transistor 914 is on. Since fuse 902 is blown, there is no path to ground for signal line 812. Similarly, if a one is programmed into circuit 900, AIN is a high logic state, AINB is a low logic state, transistor 914 is off, and transistor 920 is on. Since fuse 904 is blown, there is no path to ground for signal line 812. If AIN does not match the programmed spare address bit, circuit 900 discharges signal line 812 to a low logic state such that SWL is deselected. For example, if a zero is programmed into circuit 900 and AIN is a high logic state (AINB is a low logic state), transistor 920 is on and fuse 904 is intact creating a discharge path for signal line 812 to ground. Similarly, if a one is programmed into circuit 900 and AIN is a low logic state (AINB is a high logic state), transistor 914 is on and fuse 902 is intact creating a discharge path for signal line 812 to ground.

Figure 10:
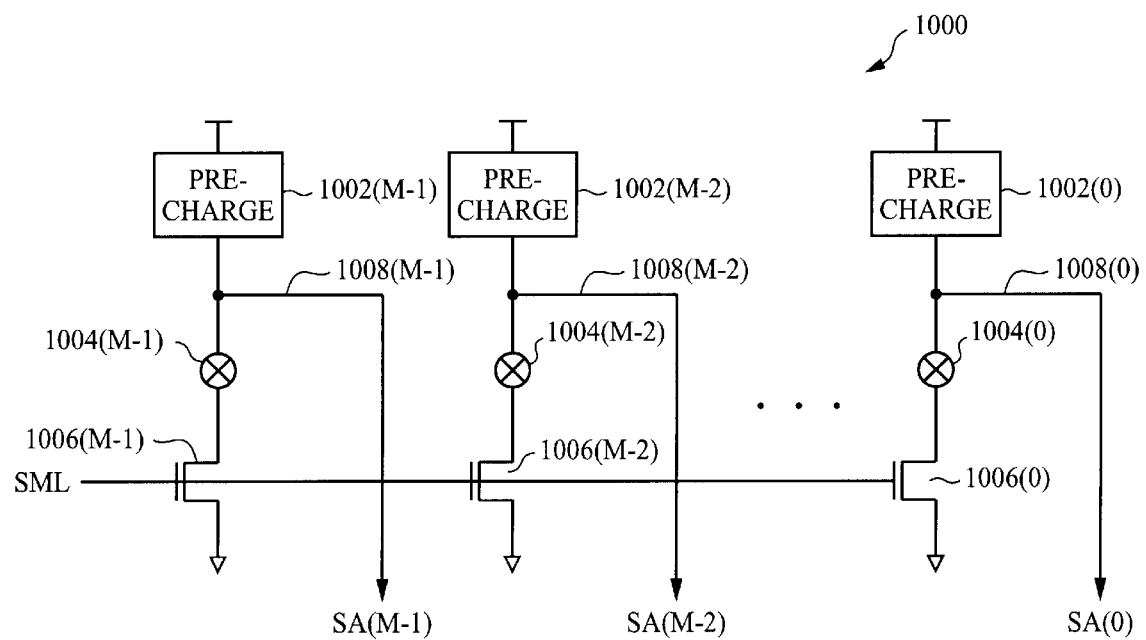
FIG. 10 is a circuit diagram of one embodiment of the spare address circuit of FIG. 1.

FIG. 10 shows spare address circuit 1000 that is one embodiment of spare address circuit 114 of FIG. 1. Other embodiments may be used. For example, the spare address circuit may be combined with the spare address decoder such that only one group of fuses need to be programmed when the spare CAM row is enabled to replace a defective row in main array 102.

Spare address circuit 1000 includes a programmable circuit for each bit of the programmed spare address. The programmed spare address is provided to priority encoder 118 when spare match line SML is asserted to a high logic state indicating that there is a match between comparand data and data stored in the spare CAM row. Each programmable circuit of spare address circuit 1000 includes a pre-charge circuit 1002 coupled in series with a fuse element 1004 and transistor 1006 between a power supply voltage and ground. Each transistor 1006 has its gate coupled to SML. Fuses 1002(m−1) through 1002(0) may be programmed electrically, may be laser fuses, or may be any other type of programmable element including a memory element. Each bit of the programmed spare address is output on signal lines 1008(m−1)–1008(0), which are each coupled to the programmable circuits between the pre-charge circuits 1002(m−1)–1002(0) and the fuse elements 1004(m−1)–1004(0), respectively. A bit is programmed to a logic one by blowing the fuse element. A bit is effectively programmed to a logic zero by leaving the fuse element intact.

Figure 11:
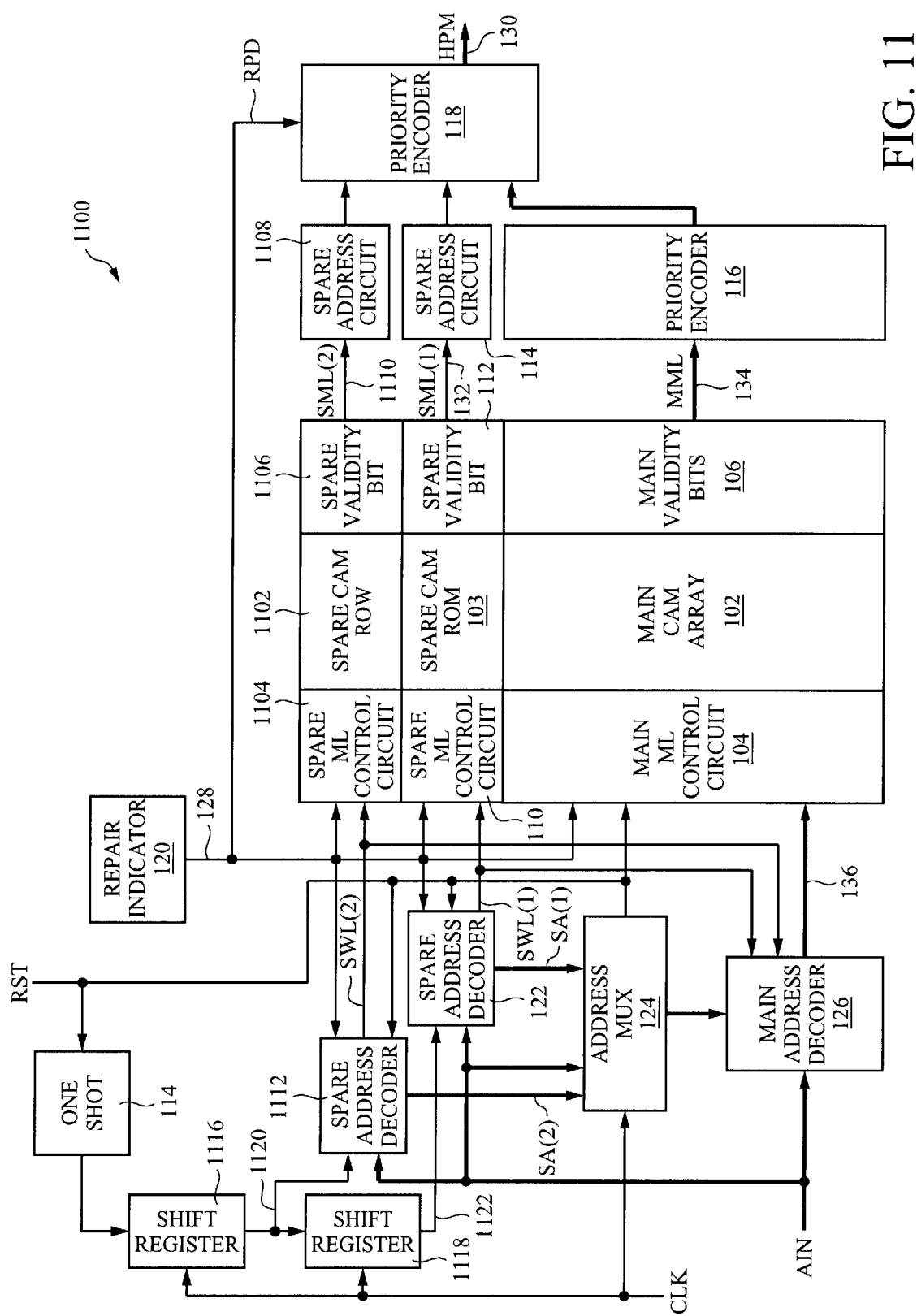
FIG. 11 is a block diagram of one embodiment of a CAM device having multiple spare rows for a main CAM array.

CAM array 101 of FIG. 1 includes a single spare CAM row 108 for main CAM array 102. In other embodiments, multiple spare rows may be available to replace multiple rows in main array 102. FIG. 11 shows CAM device 1100 that is one embodiment of CAM device 100 including two spare CAM rows 108 and 1102 for main CAM array 102. Associated with the additional spare CAM row 1102 is another spare match line control circuit 1104, spare validity bit(s) 1106, spare address decoder 1112, and spare address circuit 1108. Corresponding circuitry may be included for each additional spare CAM row included for main array 102. Spare address decoder 1112 receives RPD and may be programmed with the address of a second defective row in main array 102. During read and write operations, AIN is compared with the address stored in both of the spare address decoders, and the spare word lines SWL(1) and SWL(2) set to the appropriate logic states. As with SWL(1) output by spare address decoder 122, SWL(2) is provided by spare address decoder 1112 to main address decoder 126 to prevent the main address decoder from selecting the address of the defective row when there is a match with the programmed spare address in spare address decoder 1112.

During a reset, redundancy, or repair operation, spare address decoder 122 outputs the programmed spare address SA(1) to address multiplexer 124, and spare address decoder 1112 outputs programmed spare address SA(2) to address multiplexer 124. One-shot circuit 1114 and shift registers 1116 and 1118 control which programmed spare address is provided to main address decoder 126 at a particular time. One-shot circuit 1114 is responsive to a trigger signal that indicates that a reset, redundancy, or repair operation is taking place. RST is one embodiment of the trigger signal. When RST is asserted to a logic high state, one-shot circuit 1114 generates a one-shot pulse signal that causes shift register 1116 to output a logic high signal on signal line 1120 when CLK goes high. The signal of signal line 1120 causes spare address decoder 1112 to output SA(2) to main address decoder 126 via address multiplexer 124. Main address decoder 126 decodes SA(2) and provides the decoded spare address to main match line control circuitry 104 and main CAM array 102 over signal lines 136. In response, main match line control circuitry 104 forces the match line of the defective row in main CAM array 102 to a mismatch state to disable the defective row from affecting compare operations on the main CAM array. The mismatch state is latched or registered, as described above, such that when the reset operation is completed the mismatch state remains for the defective row. Spare CAM row 1102 is enabled to replace the row in main array 102 in response RPD.

On the next rising edge of CLK, the state of signal line 1120 is driven to a low logic state to stop spare address decoder 1112 from providing SA(2) to address multiplexer 124. This also causes shift register 1118 to output a logic one state to spare address decoder 122 on signal line 1122 such that SA(1) is provided to address multiplexer 124. Main address decoder 126 decodes SA(1) and provides the decoded spare address to main match line control circuitry 104 and main CAM array 102 over signal lines 136. Main match line control circuitry 104 forces the match line of the second defective row in main CAM array 102 to a mismatch state to disable the defective row from affecting compare operations on the main CAM array. The mismatch state is latched or registered such that when the reset operation is completed the mismatch state remains for the defective row. Spare CAM row 108 is enabled to replace the row in main array 102 in response to RPD.

For another embodiment, the outputs of shift registers 1116 and 1118 may be provided as select signals to address multiplexer 124 to select whether SA(1) or SA(2) is provided to main address decoder 126.

During a compare operation, comparand data is provided to and compared with data stored in main CAM array 102 and spare CAM rows 108 and 1102. The comparison result with the data stored in spare CAM row 108 is reflected on spare match line SML(1), the comparison result with the data stored in spare CAM row 1102 is reflected on spare match line SML(2), and the comparison results with the data stored in main CAM array 102 are reflected on main match lines MML 134. Spare match lines SML(1) and SML(2) control the output of the programmed spare addresses from spare address circuits 1108 and 114, respectively. Priority encoder 118 compares the outputs from circuits 114, 1108 and 116, and outputs the highest priority matching address HPM on signal lines 130.

Figure 12A:
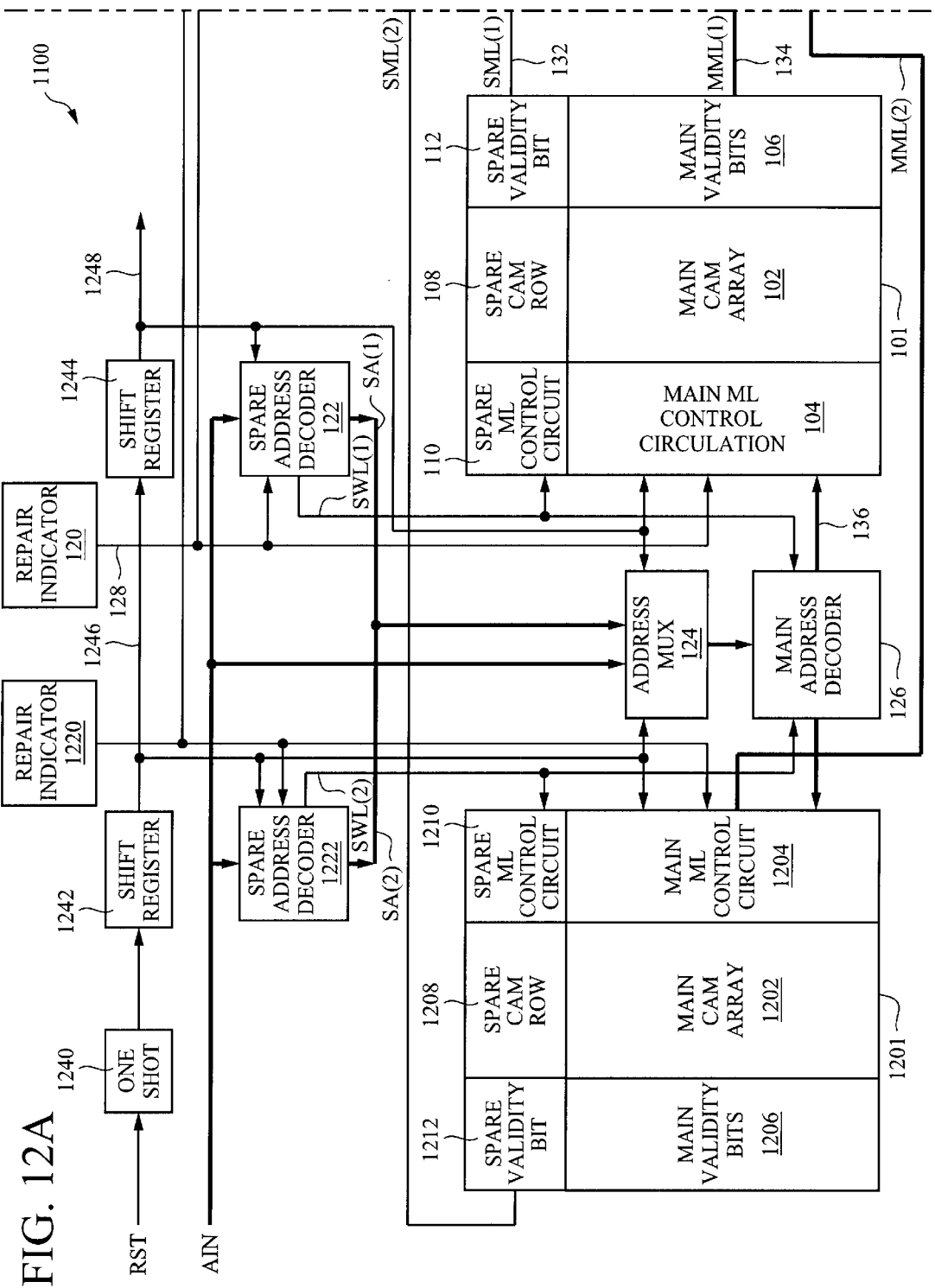
FIG. 12 is a block diagram of one embodiment of a CAM device having multiple main CAM arrays that share a main address decoder.

The embodiment of FIG. 12 shows an example of how more than one spare CAM row may be used for a main array 102. Multiple CAM arrays with redundant or spare CAM rows can also be coupled together to form larger CAM arrays. FIG. 12 shows CAM device 1200 that includes CAM device 100 of FIG. 1 and another CAM array 1201. CAM array 1201 has addresses 0 to X, and CAM array 101 has addresses X+1 to N−1, where the combined arrays have a total of N addresses for storing N entries. CAM array 1201 includes a main CAM array 1202, main validity bits 1206, main match line control circuitry 1204, spare CAM row 1208, spare match line control circuit 1210, and spare validity bit 1212. The two CAM arrays share main address decoder 126, address multiplexer 124, and priority encoders 116 and 118. The second CAM array also has associated with it spare address decoder 1222, spare address circuit 1214, and repair indicator circuit 1220. Spare address decoder 1222 and spare address circuit 1214 each store a spare address SA(2) for spare CAM row 1208. Spare address decoder 1222 and spare address circuit 1214 may be combined into a single circuit. Repair indicator circuit asserts RPD(2) to a high logic state when a defective row of main array 1202 is replaced by spare CAM row 1208.

During read and write operations, AIN is compared with the address stored in both of the spare address decoders. If there is a match, spare word lines SWL(1) and SWL(2) are set to the appropriate logic state. As with SWL(1) output by spare address decoder 122, SWL(2) is provided by spare address decoder 1222 to main address decoder 126 to prevent the main address decoder from selecting the address of the defective row when there is a match with the programmed spare address in spare address decoder 1222.

During a reset, redundancy or repair operation, spare address decoder 122 outputs the programmed spare address SA(1) to address multiplexer 124, and spare address decoder 1222 outputs programmed spare address SA(2) to address multiplexer 124. One-shot circuit 1240 and shift registers 1242 and 1244 control which programmed spare address is provided to address multiplexer 124 and main address decoder 126 at a particular time. One-shot circuit 1240 is responsive to a trigger signal that indicates that a reset, redundancy, or repair operation is taking place. RST is one embodiment of the trigger signal. When RST is asserted to a logic high state, one-shot circuit 1240 generates a one-shot pulse signal that causes shift register 1242 to output a logic high signal on signal line 1246 when CLK goes high. The signal of signal line 1246 causes spare address decoder 1222 to output SA(2) to main address decoder 126 via address multiplexer 124. Main address decoder 126 decodes SA(2) and provides the decoded spare address to main match line control circuitry 1204 and main CAM array 1202. In response, main match line control circuitry 1204 forces the match line of the defective row in main CAM array 1202 to a mismatch state to disable the defective row from affecting compare operations on the main CAM array. The mismatch state is latched or registered, as described above, such that when the reset operation is completed the mismatch state remains for the defective row. Spare CAM row 1208 is enabled to replace the row in main array 1202 in response RPD(2).

On the next rising edge of CLK, the state of signal line 1246 is driven to a low logic state to stop spare address decoder 1222 from providing SA(2) to address multiplexer 124. This also causes shift register 1244 to output a logic one state to spare address decoder 122 such that SA(1) is provided to main address decoder 126 via address multiplexer 124. Main address decoder 126 decodes SA(1) and provides the decoded spare address to main match line control circuitry 104 and main CAM array 102 over signal lines 126. Main match line control circuitry 104 forces the match line of the second defective row in main CAM array 102 to a mismatch state to disable the defective row from affecting compare operations on the main CAM array. The mismatch state is latched or registered such that when the reset operation is completed the mismatch state remains for the defective row. Spare CAM row 1102 is enabled to replace the row in main array 102 in response RPD(1).

For another embodiment, the outputs of shift registers 1242 and 1244 may be provided as select signals to address multiplexer 124 to select whether SA(1) or SA(2) is provided to main address decoder 126.

During a compare operation, comparand data is provided to and compared with data stored in main CAM array 102, spare CAM rows 108, main CAM array 1202, and spare CAM row 1208. The compare operation may occur sequentially on array 1201 and then array 101, or it may occur simultaneously on the two arrays. The comparison result with the data stored in spare CAM row 108 is reflected on spare match line SML(1), the comparison result with the data stored in spare CAM row 1202 is reflected on spare match line SML(2), the comparison results with the data stored in main CAM array 102 is reflected on main match lines MML(1), and the comparison results with the data stored in main CAM array 1202 is reflected on main match lines MML(2). Spare match lines SML(1) and SML(2) control the output of the programmed spare addresses from spare address circuits 1214 and 114, respectively. Priority encoder 118 compares the outputs from circuits 114, 1214 and 116, and outputs the highest priority address as HPM on signal lines 130.

Additional CAM arrays can be added to CAM device 1200 to increase the number of available CAM entries. For each additional CAM array, another shift register is added to control when a programmed spare address will be provided to the common address multiplexer 124 and main address decoder 126.

When the main match line control circuitry of FIG. 12 is implemented as latch circuits as shown in FIG. 4, a timing generator such as timing generator 412 is used to generate the redundancy clock signal RCLK. The timing generator may also generate RCLK in response to the signals output from the shift registers such that the main match lines are not pre-charged or discharged by the latch circuits until the one-shot signal output by one of the shift registers has been asserted to a high logic state. For example, a timing generator associated with main match line control circuitry 104 may not pre-charge or discharge the main match lines MML(1) until the one-shot signal output by the shift register 1244 on signal on line 1248 has been asserted to a high logic state. For one embodiment, the timing generator may be an AND gate that logically combines RST, CLK, RPD and the output of the appropriate shift register. For another embodiment, the timing generator may be a gated clock generator. One embodiment of a gated clock generator is shown in FIG. 13.

Figure 13:
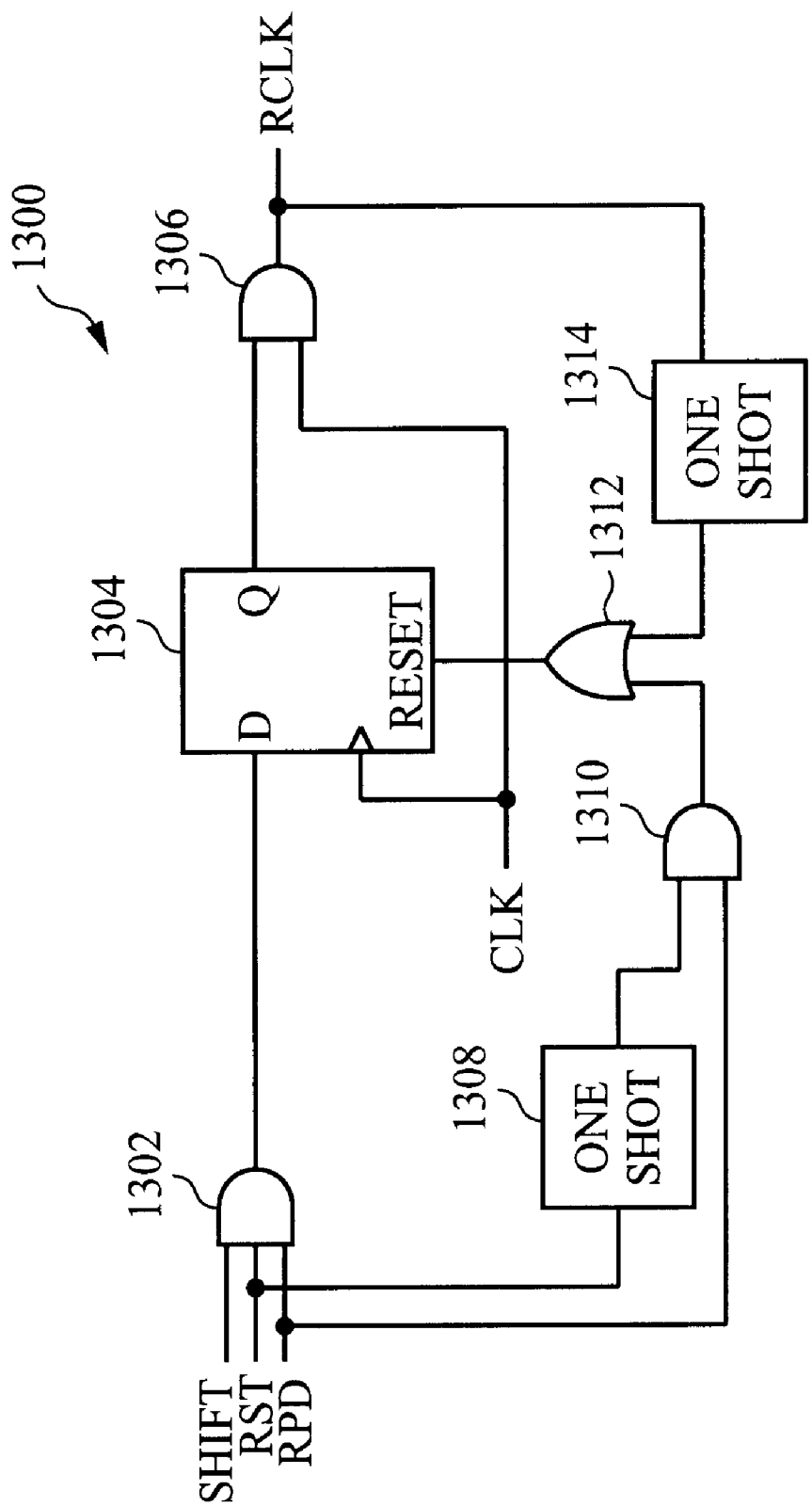
FIG. 13 is a logic diagram of one embodiment of a redundancy clock generator circuit.

Timing generator 1300 of FIG. 13 includes register 1304 and AND gates 1302 and 1306 that determine the state of RCLK in response to CLK. AND gate 1302 receives RST, RPD, and SHFTO (the output of one of shift registers 1242 or 1244) and drives the data input of register 1304. The data output of register 1304 is provided to AND gate 1306 and with CLK to generate RCLK. Timing generator 1300 also includes reset circuitry that resets RCLK to a low logic state after RST transitions to a high logic state and after RCLK transitions to a low logic state. The reset circuitry includes one-shot circuits 1308 and 1314, AND gate 1310, and OR gate 1312. When RST transitions to a logic high state and RPD is in a high logic state, one-shot circuit 1308 generates a pulse signal that causes AND gate 1310 and OR gate 1312 to reset register 1304. When RCLK transitions to a low logic state, one-shot circuit 1314 generates a pulse signal that causes OR gate 1312 to reset register 1304. Timing generator 1300 may also be used for CAM device 1100 of FIG. 11.

As described above with respect to FIGS. 1–13, a defective row in a CAM array may be replaced by the spare row in the CAM array. Unfortunately, if a particular CAM array has more defective rows than spare rows, the array may no longer be suitable for use, since the row addresses of any remaining defective rows may not be available. For example, referring to device 1200 of FIG. 12, since CAM arrays 101 and 1201 each include only one spare row 108 and 1208, respectively, if array 101 has two defective rows, only one of the defective rows may be replaced by spare row 108. Here, since there is not another spare row in array 101 to replace the remaining defective row, array 101 may be considered defective and thus unusable, even though spare row 1208 in array 1202 may be available.

Figure 14:
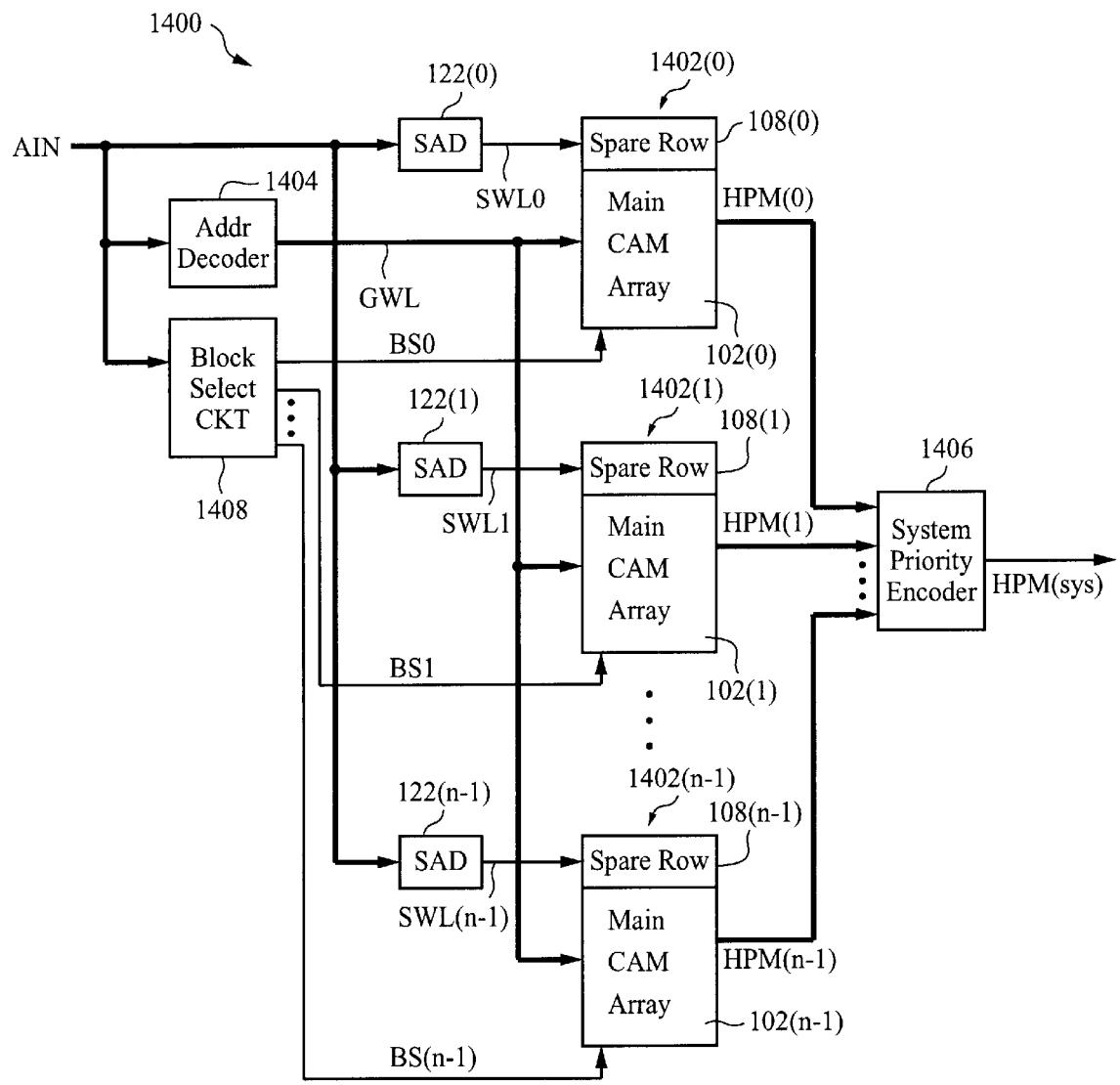
FIG. 14 is a block diagram of one embodiment of a CAM device including a plurality of CAM blocks each having a spare row that may be programmed to replace a defective row in any CAM block in the device.

In other embodiments of the present invention, one or more spare rows in one CAM array may be used to replace one or more defective rows in another CAM array. FIG. 14 shows one embodiment of a CAM device 1400 that allows for the spare row(s) in a CAM block to functionally replace defective rows in the same CAM block or in another CAM block. CAM device 1400 includes a plurality of CAM blocks 1402(0)–1402(n−1) and associated spare address decoders (SAD) 122(0)–122(n−1), a main address decoder 1404, a system priority encoder 1406, and a block select circuit 1408. Each CAM block 1402 includes CAM array 101 of FIG. 1, and for simplicity is shown in FIG. 14 to include only main CAM array 102 and a spare row 108 of CAM cells. In other embodiments, each CAM block 1402 may include more than one spare row 108. Other elements of device 1400, such as for instance, repair indicator circuits, are similar to the embodiment of FIG. 1, and are thus not shown in FIG. 14 for simplicity.

Each main CAM array 102(0)–102(n−1) includes a plurality of rows of CAM cells, where each row is coupled to a word line. The word lines of CAM arrays 102(0)–102(n−1) are selectively coupled to corresponding global word lines GWL in response to block select signals BS(0)–BS(n−1), respectively. Similarly, spare address decoders 122(0)–122(n−1) are selectively coupled to corresponding spare rows 108(0)–108(n−1) via spare word lines SWL(0)–SWL(n−1) in response to BS(0)–BS(n−1), respectively. The block select signals BS(0)–BS(n−1) are generated by block select circuit 1408, and may be used to re-address defective rows in a CAM block to a spare row in any CAM block 1402(0)–1402(n−1).

Main CAM arrays 102(0)–102(n−1) have consecutively numbered row addresses, with the first row in the first block 1402(0) being the highest-priority address, and the last row in the last CAM block 1402(n−1) being the lowest-priority address, although other addressing schemes may be used. Referring also to FIGS. 1 and 12, each CAM block 1402(0)–1402(n−1) also includes spare address circuit 114 to generate highest-priority match signals HPM(0)–HPM(n−1), respectively, during compare operations between comparand data and data stored in CAM blocks 1402(0)–1402(n−1). HPM(0)–HPM(n−1) are combined in system priority encoder 1406 to generate the system highest-priority match HPM(sys). System priority encoder 1406 may include priority encoder 116 and 118 of FIGS. 1–3 and/or 11–12.

Each spare CAM row 108(0)–108(n−1) may be programmed to replace a defective row of CAM cells in any CAM block 1402(0)–1402(n−1). Main CAM arrays 102(0)–102(n−1) are initially tested using any generally known testing methodology and hardware to determine if any of the CAM cells therein are defective. When a defective CAM cell is detected, the row address of the defective CAM cell is programmed into one of spare address decoders 122(0)–122(n−1) and into spare address circuit 114 (not shown) such that the programmed address becomes the address of the corresponding spare CAM row 108(0)–108(n−1), respectively. All programmed addresses may also be stored in block select circuit 1408. Since the spare row 108 in a particular CAM block 1402 may be programmed to replace defective rows in other CAM blocks 1402, if more than one defective row is detected in a first CAM block 1402, spare rows 108 in other CAM blocks 1402 may be used to functionally replace the defective rows in the first CAM block 1402.

For example, if during testing it is determined that CAM block 1402(0) has two defective rows and all other CAM blocks 1402(1)–1402(n−1) have no defective rows, spare row 108(0) in CAM block 1402(0) may be used to replace the first defective row in CAM block 1402(0), and spare row 108(1) of CAM block 1402(1) may be used to replace the second defective row in CAM block 1402(0). In this manner, embodiments of FIG. 14 may allow for normal operation when there are more defective rows than spare rows in a particular CAM block.

During read and write operations, input address AIN is provided to address decoder 1404, block select circuit 1408, and spare address decoders 122(0)–122(n−1). Address decoder 1404 provides a decoded row address to CAM blocks 1402(0)–1402(n−1) by asserting one of the global word lines GWL. For alternative embodiments, each CAM block may have its own local decoder, or groups of CAM blocks may share local decoders. Spare address decoders 122(0)–122(n−1) compare AIN with programmed addresses stored therein to selectively enable SWL(0)–SWL(n−1) while disabling main address decoder 1404 from asserting GWL, as described above with respect to FIGS. 1–7. Block select circuit 1408 compares AIN with programmed addresses stored therein, and in response thereto selectively asserts block select signals BS(0)–BS(n−1) to enable one of CAM blocks 1402(0)–1402(n−1) to latch the asserted GWL or SWL for the read or write operation. Data is then read from or written to the corresponding main row or spare row in the CAM block 1402 selected by block select circuit 1408. In this manner, block select circuit 1408 allows each spare row 108(0)–108(n−1) to functionally replace a defective row in any CAM block 1402(0)–1402(n−1) for read and write operations.

Figure 15:
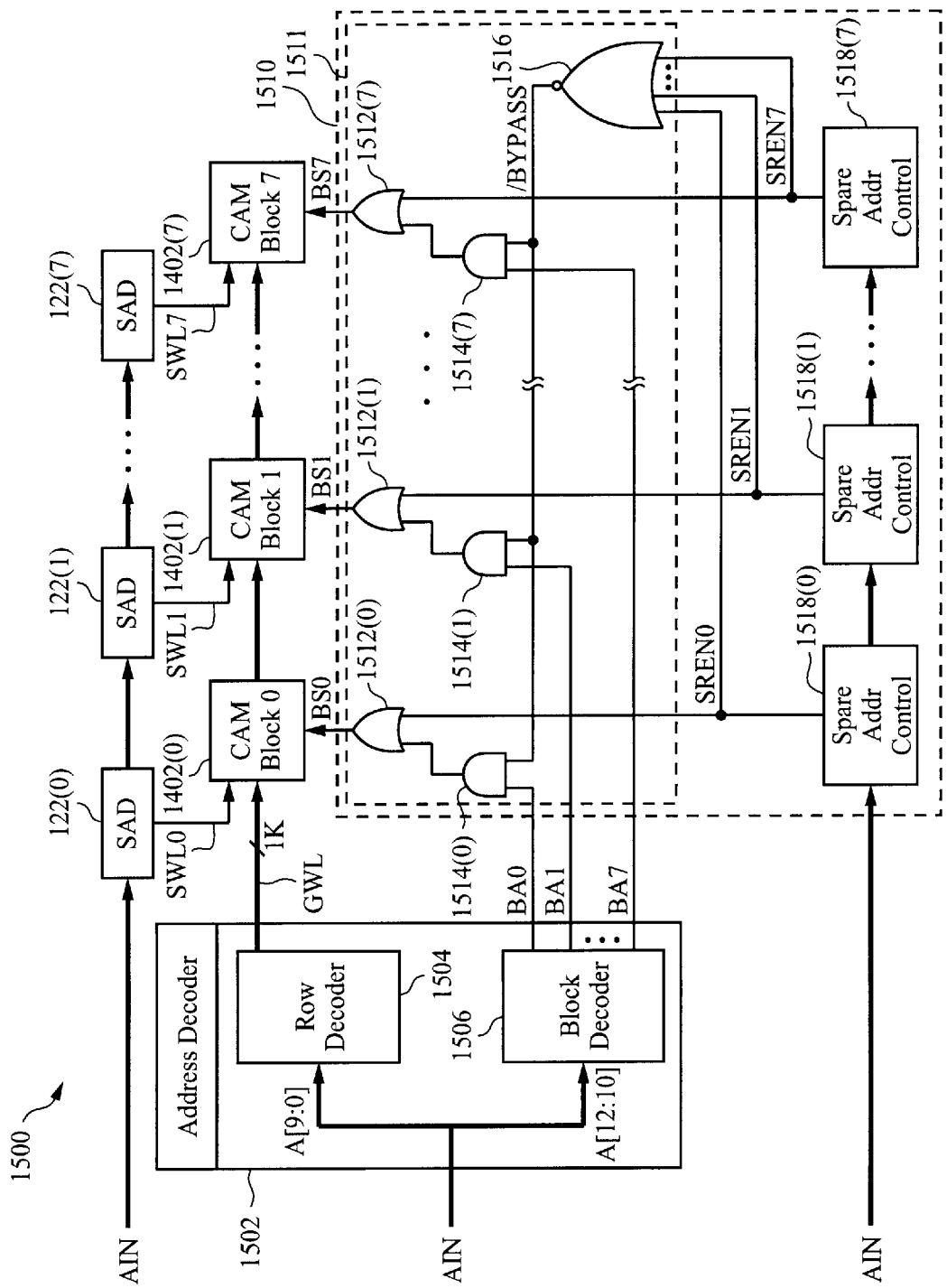
FIG. 15 is a block diagram of one embodiment of the CAM device of FIG. 14.

FIG. 15 shows a CAM device 1500 that is an exemplary embodiment of CAM device 1400. CAM device 1500 is shown to include 8 CAM blocks 1402(0)–1402(7) and associated spare address decoders 122(0)–122(7), a main address decoder 1502, and a block select circuit 1510. Each CAM block 1402(0)–1402(7) includes 1 k (1024) rows of CAM cells selectively coupled to the corresponding 1 k global word lines GWLs in response to BS0–BS7, respectively, and a spare row of CAM cells selectively coupled to a corresponding spare word line SWL in response to BS0–BS7, respectively. In one embodiment, the global word lines GWL are selectively coupled to corresponding word lines in each CAM block 1402(0)–1402(7) using logic gates responsive to BS0–BS7, respectively.

Figure 16:
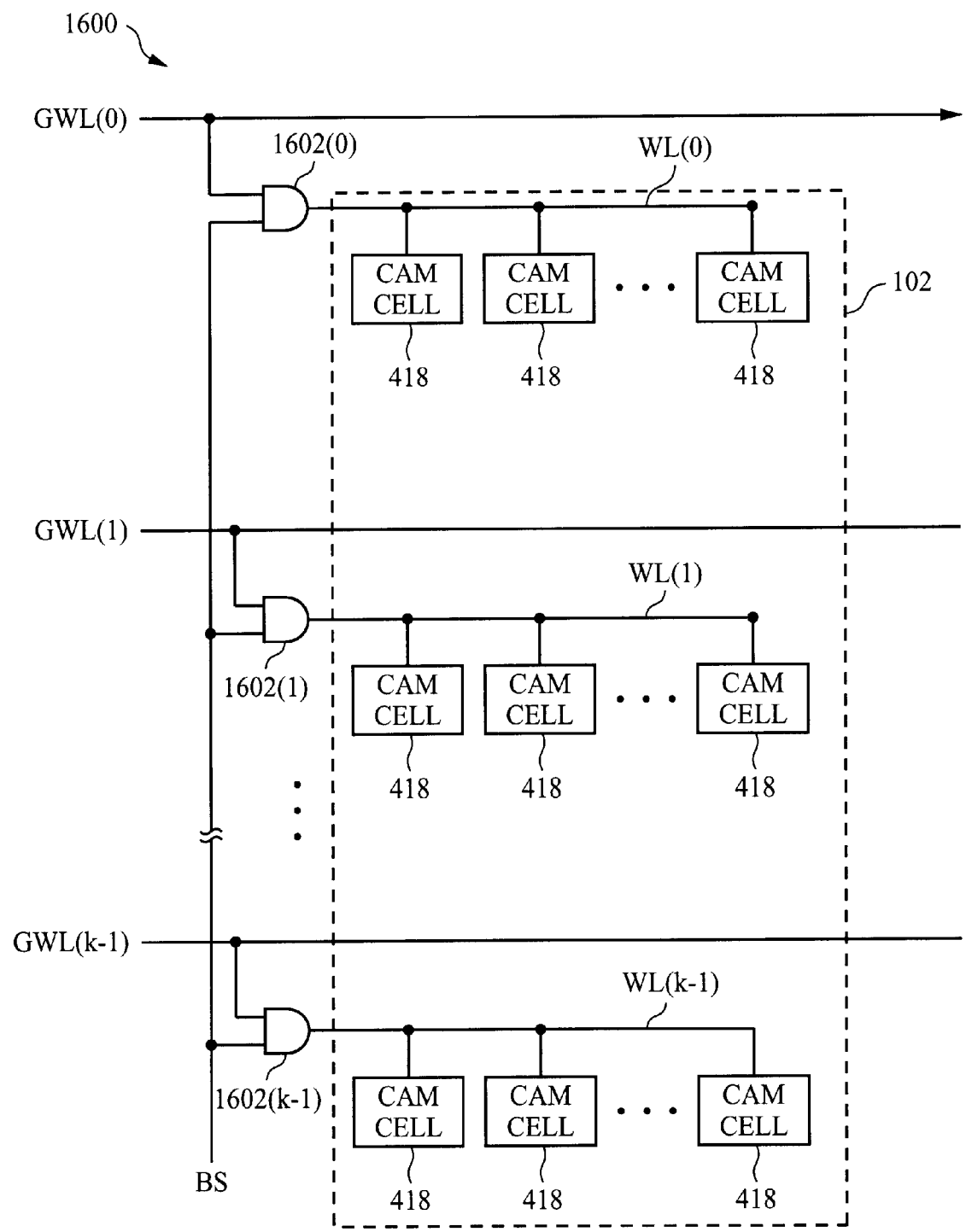
FIG. 16 is a simplified block diagram of a CAM block in one embodiment of the CAM device of FIG. 14.

For example, FIG. 16 is one embodiment 1600 of CAM block 1402 of device 1500 in which AND gates 1602(0)–1602(k-1) are used to selectively couple global word lines GWL(0)–GWL(k-1) to corresponding word lines WL(0)–WL(k-1) of the CAM array 102 in response to BS. Here, each AND gate 1602 includes a first input terminal coupled to a corresponding GWL, a second input terminal coupled to receive BS, and an output terminal coupled to the corresponding word line WL in CAM array 102. When BS is de-asserted to logic low, AND gates 1602(0)–1602(k-1) force respective word lines WL(0)–WL(k-1) to logic low, thereby disabling WL(0)–WL(k-1). Conversely, when BS is asserted to logic high, AND gates 1602(0)–1602(k-1) allow an asserted one of GWL(0)–GWL(k-1) to drive a corresponding one of WL(0)–WL(k-1) to logic high to allow access to the selected row of CAM cells 418 of CAM array 102. The spare word lines SWL(0)–SWL(7) may be selectively coupled to spare rows in CAM blocks 1402(0)–1402(7), respectively, in a similar manner. For alternative embodiments, each CAM block may have its own local decoder (or groups of CAM blocks may share a local decoder) and local word line gated by one of the block select signals.

Address decoder 1502, which is one embodiment of address decoder 1402, is illustrated in FIG. 15 as partitioned into a row decoder 1504 and a block decoder 1506, where the 3 most significant bits (MSBs) of AIN, A[12:10], which represent a block address, are provided to block decoder 1506, and the 10 least significant bits (LSBs) of AIN, A[9:0], which represent a row address, are provided to row decoder 1504. Row decoder 1504 decodes the row address A[9:0], and in response thereto asserts a corresponding one of the 1 k global word lines GWL to logic high. Block decoder 1506 decodes the block address A[12:10], and in response thereto asserts one of block address signals BA0–BA7 corresponding to CAM blocks 1402(0)–1402(7), respectively.

Block select circuit 1510 is one embodiment of block select circuit 1408 and is shown in FIG. 15 to include block select logic 1511 and 8 spare address control circuits 1518(0)–1518(7) corresponding to CAM blocks 1402(0)–1402(7), respectively. Each spare address control circuit 1518(0)–1518(7) includes a memory element to store a programmed address for the spare row in the corresponding CAM block 1402, and also includes a compare circuit. In some embodiments, each spare address control circuit 1518 is spare address decoder 122, the operation of one embodiment of which is described above with respect to FIG. 8.

Block select logic 1511 includes OR gates 1512(0)–1512(7), AND gates 1514(0)–1514(7), and a NOR gate 1516. NOR gate 1516 includes 8 input terminals coupled to respective output terminals of spare address control circuits 1518(0)–1518(7), and an output terminal coupled to a first input terminal of each AND gate 1514(0)–1514(7). The other input terminals of AND gate 1514(0)–1514(7) are coupled to receive block address signals BA(0)–BA(7), respectively. OR gates 1512(0)–1512(7) include first input terminals coupled to output terminals of AND gates 1514(0)–1514(7), respectively, second input terminals coupled to the output terminals of spare address control circuit 1518(0)–1518(7), respectively, and output terminals to provide block select signals BS0–BS7 to CAM block 1402(0)–1402(7), respectively.

During a read or write operation, AIN is provided to address decoder 1502, to each spare address decoder 122(0)–122(7), and to each spare address control circuit 1518(0)–1518(7). Row decoder 1504 asserts one of the global word lines GWL in response to decoding row address bits A[9:0], and block decoder 1506 asserts one of block address signals BA0–BA7 in response to decoding block address bits A[12:10]. Each spare address decoder 122(0)–122(7) compares AIN with the programmed address therein and, if there is a match, asserts the corresponding SWL and disables address decoder 1502 in the manner described above, for instance, with respect to FIGS. 4–7, to prevent assertion of GWL to logic high. If there is not a match, spare address decoders 122(0)–122(7) do not assert SWL(0)–SWL(7), respectively, and do not disable address decoder 1502 from asserting one of GWL.

Each spare address control circuit 1518(0)–1518(7) compares AIN with the programmed address stored in its memory element to generate a spare row enable signal SREN0–SREN7, respectively. If there is not a match, each spare address control circuit 1518 de-asserts its SREN signal to logic low. Here, since all signals SREN0–SREN7 are logic low, NOR gate 1516 provides a de-asserted, logic high bypass signal /BYPASS to AND gates 1514(0)–1514(7), which in turn allows the block address signals BA0–BA7 to propagate through AND gates 1514(0)–1514(7) and OR gates 1512(0)–1512(7) to corresponding CAM blocks 1402(0)–1402(7) as block select signals BS0–BS7, respectively. In this manner, block select logic 1511 selects the CAM block 1402(0)–1402(7) identified by A[12:10] via block address signals BA0–BA7 for the operation. The logic states of GWL are latched onto the word lines of the CAM block 1402 selected by BS0–BS7 to enable the selected row address for the operation.

Conversely, if AIN matches a programmed address stored in one of spare address control circuits 1518(0)–1518(7), the spare address control circuit 1518 having the match condition asserts its SREN signal to logic high, which in turn is propagated to the corresponding CAM block 1402 as the block select signal BS. The asserted SREN signal forces /BYPASS to logic low, which in turn forces the output of each AND gate 1514(0)–1514(7) to logic low to prevent block address signals BA0–BA7 from selecting one of CAM blocks 1402(0)–1402(7) for the operation. In this manner, block select logic 1511 selects for the operation the CAM block 1402 having a spare row programmed address that matches AIN, regardless of the block address A[12:10] of AIN. The spare address decoder 122 of the selected CAM block 1402 asserts SWL to enable access to the spare row in the selected CAM block 1402.

For example, in a first illustrative scenario, a well-known testing procedure determines that there are no defective CAM cells in CAM device 1500, and thus none of the spare rows in CAM blocks 1402(0)–1402(7) are used. Consequently, there are no programmed addresses stored in spare row decoders 122(0)–122(7) or in spare address control circuits 1518(0)–1518(7). As a result, during subsequent read or write operations, data is read from or written to the row identified by AIN in a normal manner. For example, if AIN=0000000000000, which corresponds to the first row (row 0) in the first CAM block 1402(0), address decoder 1502 decodes A[9:0] to assert the first global word line GWL0, and decodes A[12:10] to assert the first block address signal BA0. Since there are no programmed addresses stored in spare address decoders 122(0)–122(7), spare address decoders 122(0)–122(7) do not assert SWL0–SWL7, respectively, and do not disable GWL. Similarly, since there are no programmed addresses stored in spare address control circuits 1518(0)–1518(7), spare address control circuits 1518(0)–1518(7) do not assert SREN0–SREN7, respectively. Thus, /BYPASS remains in a logic high state, and the asserted block address signal BA0 propagates through AND gate 1514(0) and OR gate 1512(0) as BS0 to select CAM block 1402(0). In response to BS0, CAM block 1402 latches the asserted state of GWL0 onto its first word line WL0 to enable the corresponding row for the operation.

In a second illustrative scenario, a well-known testing procedure determines that the first two rows (rows 0 and 1) in first CAM block 1402(0) are defective, and all other rows in device 1500 are non-defective. In one embodiment, the first defective row (row 0) in CAM block 1402(0) may be functionally replaced by the spare row in CAM block 1402(0) by programming its address, e.g., SA0=0000000000000, into spare address decoder 122(0) and spare address control circuit 1518(0), and the second defective row (row 1) in CAM block 1402(0) may be functionally replaced by the spare row in CAM block 1402(1) by programming its address, e.g., SA1=0000000000001, into spare address decoder 122(1) and spare address control circuit 1518(1). As a result, subsequent read or write operations addressing the first defective row (row 0) of CAM block 1402(0) are instead addressed to the spare row in CAM block 1402(0), and subsequent read or write operations addressing the second defective row (row 1) of CAM block 1402(0) are instead addressed to the spare row in CAM block 1402(1).

For example, if AIN=0000000000000, address decoder 1502 decodes A[9:0] to assert a first global word line GWL0, and decodes A[12:10] to assert the first block address signal BA0. AIN is compared with programmed addresses stored in spare address decoders 122(0)–122(7) to assert SWL0–SWL7, respectively, and with programmed addresses stored in spare address control circuits 1518(0)–1518(7) to generate SREN0–SREN7, respectively. Here, AIN matches SA0 stored in spare address decoder 122(0) and spare address control circuit 1518(0). As a result, spare address decoder 122(0) asserts SWL0 to logic high, and prevents address decoder 1502 from asserting GWL0 to logic high. Spare address control circuit 1518(0) asserts SREN0 to logic high, which in turn propagates as BS0 to select CAM block 1402(0) for the operation. In response thereto, CAM block 1402(0) latches the asserted SWL0 to enable its spare row for the operation. SREN1–SREN7 are logic low and thus do not select CAM blocks 1402(1)–1402(7). /BYPASSS is asserted to logic low to prevent BA0–BA7 from selecting corresponding CAM blocks 1402(0)–1402(7). In this manner, data to be read from or written to row 0 in CAM block 1402(0) is instead read from or written to the spare row in CAM block 1402(0).

On the other hand, if AIN=0000000000001, which corresponds to the second row (row 1) in the first CAM block 1402(0), address decoder 1502 decodes A[9:0] to assert a second global word line GWL1, and decodes A[12:10] to assert the first block address signal BA0. AIN is compared with programmed addresses stored in spare address decoders 122(0)–122(7) to assert SWL0–SWL7, respectively, and with programmed addresses stored in spare address control circuits 1518(0)–1518(7) to generate SREN0–SREN7, respectively. Here, AIN matches SA1 stored in spare address decoder 122(1) and spare address control circuit 1518(1). As a result, spare address decoder 122(1) asserts SWL(1) to logic high, and prevents address decoder 1502 from asserting GWL1 to logic high. Spare address control circuit 1518(1) asserts SREN1 to logic high, which in turn propagates as BS1 to select CAM block 1402(1) for the operation. In response thereto, CAM block 1402(1) latches the asserted SWL1 to enable its spare row 108 for the operation. SREN0 and SREN2–SREN7 are logic low and thus do not select CAM blocks 1402(0) and 1402(2)–1402(7), respectively. /BYPASSS is asserted to logic low to prevent BA0–BA7 from selecting corresponding CAM blocks 1402(0)–1402(7). In this manner, data to be read from or written to the second row in CAM block 1402(0) may instead be read from or written to the spare row in CAM block 1402(1), thereby functionally replacing a defective row in first CAM block with the spare row in a second CAM block.

Figure 17:
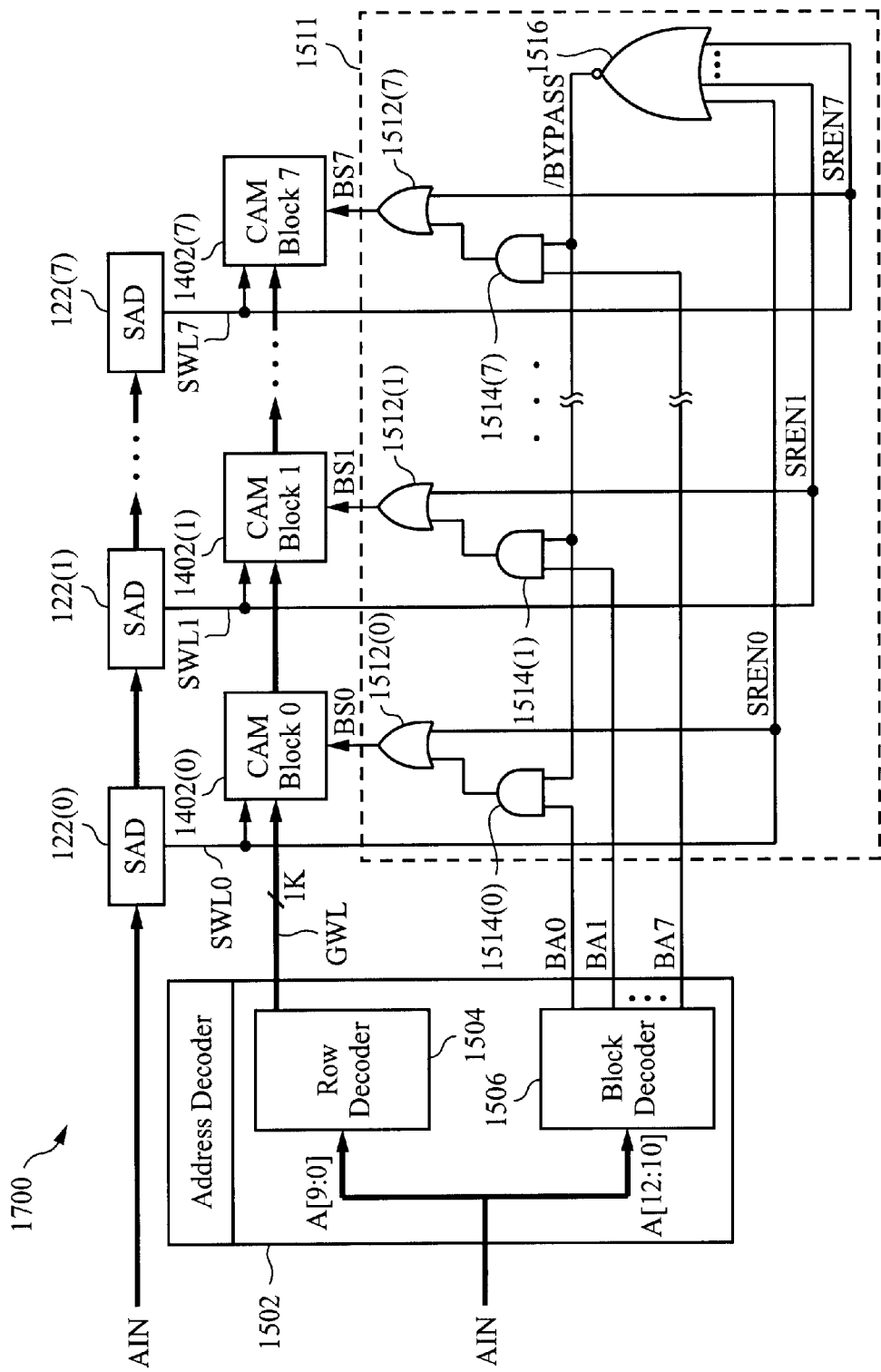
FIG. 17 is a block diagram of another embodiment of the CAM device of FIG. 14.

Since spare address decoders 122(0)–122(7) each store the same programmed address as corresponding spare address control circuits 1518(0)–1518(7), respectively, SWL0–SWL7 are simultaneously asserted with SREN0–SREN7, respectively, when the programmed addresses are compared to AIN. Thus, in other embodiments, spare address control circuits 1518(0)–1518(7) may be omitted, and the logic states of SWL0–SWL7 may be used as spare row enable signals SREN0–SREN7, respectively, as illustrated by device 1700 in FIG. 17. The elimination of spare address control circuits 1518(0)–1518(7) from device 1700 advantageously reduces silicon area.

The ability to replace defective rows in a first CAM block with spare rows in other CAM blocks may increase manufacturing yield, since the existence of more defective rows than spare rows in a particular CAM block may no longer automatically render the CAM block useless. Indeed, as long as the total number of defective rows in device 1400 is less than or equal to the total number of spare rows in all CAM blocks 1402, each defective row may be functionally replaced with spare rows from any CAM block. The ability to replace defective rows in one CAM block with spare rows from other CAM blocks may also eliminate the need for incorporating multiple spare rows into each CAM block, which in turn may save silicon area, since the functional replacement of defective rows may be distributed across CAM blocks. For example, in one embodiment of CAM device 1500, where each CAM block 1402(0)–1402(7) includes only one spare row, up to 8 defective rows in device 1500 may be functionally replaced, even where all 8 defective rows are in the same CAM block, and therefore provides increased redundancy programming flexibility.

We claim:

1. A content addressable memory (CAM) device comprising:
   a plurality of CAM blocks, each having an array including a number of rows of CAM cells and a spare row of CAM cells;
   means for disabling a defective row in a first CAM block; and
   means for enabling a spare row in a second CAM block to functionally replace the defective row in the first CAM block.

2. The CAM device of claim 1, wherein each row of CAM cells is coupled to a match line and to a word line, and each spare row of CAM cells is coupled to a spare match line and to a spare word line.

3. The CAM device of claim 2, wherein the means for disabling controls the logical state of each match line in response to a repair signal which indicates the existence of the defective row.

4. The CAM device of claim 2, wherein the means for disabling forces the match line to a mismatch state if the corresponding row is defective.

5. The CAM device of claim 2, wherein the means for disabling comprises a plurality of latch circuits each having a data input coupled to one of the word lines, an output coupled to one of the match lines, and a clock input responsive to a repair signal which indicates the existence of the defective row.

6. The CAM device of claim 5, wherein the clock input of each latch circuit is further responsive to a reset signal for the CAM device.

7. The CAM device of claim 2, wherein the means for enabling controls the logical state of the spare match line in response to a repair signal which indicates the existence of the defective row.

8. The CAM device of claim 7, wherein the means for enabling selectively pre-charges the spare match line in response to the repair signal.

9. The CAM device of claim 7, wherein the means for enabling comprises a buffer having an input responsive to the repair signal and having an output coupled to the spare match line.

10. The CAM device of claim 2, wherein the spare word line of each CAM block is coupled to a spare address decoder.

11. A content addressable memory (CAM) device having a plurality of CAM blocks, each comprising:
   a number of rows of CAM cells each coupled to a word line and to a match line;
   a spare row of CAM cells coupled to a spare match line and to a spare word line, the spare row of CAM cells selectable to functionally replace a defective row of CAM cells in any of the CAM blocks;
   a plurality of latch circuits each having a data input coupled to one of the word lines, an output coupled to one of the match lines, and a clock input responsive to a repair signal which indicates the existence of the defective row; and
   a buffer having an input responsive to the repair signal and having an output coupled to the spare match line.

12. The CAM device of claim 11, wherein each latch circuit controls the logical state of its corresponding match line in response to the repair signal.

13. The CAM device of claim 11, wherein each latch circuit forces its corresponding match line to a mismatch state if its corresponding row is defective.

14. The CAM device of claim 11, wherein each buffer controls the logical state of its corresponding spare match line in response to the repair signal.

15. The CAM device of claim 11, wherein each buffer selectively pre-charges its corresponding spare match line in response to the repair signal.

16. A method of operating a content addressable memory (CAM) device having a plurality of CAM blocks each including a number of rows of CAM cells and a spare row of CAM cells, the method comprising:
   disabling a defective row in a first CAM block; and
   enabling the spare row in a second CAM block to functionally replace the defective row in the first CAM block.

17. The method of claim 16, wherein the disabling comprises controlling the logical state of a match line of the defective row in response to a repair signal which indicates the existence of the defective row.

18. The method of claim 16, wherein the disabling comprises forcing a match line of the defective row to a mismatch state.

19. The method of claim 16, wherein the enabling comprises controlling the logical state of a spare match line of the spare row in response to a repair signal which indicates the existence of the defective row.

20. The method of claim 16, wherein the enabling comprises pre-charging a spare match line of the spare row.

* * * * *